US012066506B2

(12) United States Patent
Akushichi et al.

(10) Patent No.: US 12,066,506 B2
(45) Date of Patent: Aug. 20, 2024

(54) MAGNETIC SENSOR

(71) Applicant: TDK Corporation, Tokyo (JP)

(72) Inventors: Taiju Akushichi, Tokyo (JP); Makoto Kameno, Tokyo (JP); Tamon Kasajima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 125 days.

(21) Appl. No.: 17/778,249

(22) PCT Filed: Jul. 30, 2020

(86) PCT No.: PCT/JP2020/029194
§ 371 (c)(1),
(2) Date: May 19, 2022

(87) PCT Pub. No.: WO2021/100252
PCT Pub. Date: May 27, 2021

(65) Prior Publication Data
US 2022/0349960 A1 Nov. 3, 2022

(30) Foreign Application Priority Data

Nov. 22, 2019 (JP) .................................. 2019-211066

(51) Int. Cl.
*G01R 33/025* (2006.01)
*G01R 33/09* (2006.01)
(52) U.S. Cl.
CPC .......... *G01R 33/025* (2013.01); *G01R 33/09* (2013.01)
(58) Field of Classification Search
None
See application file for complete search history.

(56) References Cited

U.S. PATENT DOCUMENTS

2010/0301852 A1* 12/2010 Teppan .................. G01R 15/18
324/253
2018/0149678 A1* 5/2018 Wolf .................... G01R 15/185
(Continued)

FOREIGN PATENT DOCUMENTS

JP          09-113592 A       5/1997
JP       2003-139828 A       5/2003
(Continued)

OTHER PUBLICATIONS

International Search Report issued in corresponding International Patent Application No. PCT/JP2020/029194, dated Oct. 27, 2020, with English translation.
(Continued)

*Primary Examiner* — Jas A Sanghera
(74) *Attorney, Agent, or Firm* — Rimon P.C.

(57) ABSTRACT

To provide a small-sized magnetic sensor capable of achieving closed-loop control. A magnetic sensor includes: a sensor chip mounted on a surface of a substrate such that an element formation surface is perpendicular to the surface of the substrate or inclined by a predetermined angle with respect thereto; an external magnetic member mounted on the surface of the substrate and collecting a magnetic field to be detected in a magnetosensitive element; and a compensating coil wound around the external magnetic member. The compensating coil is thus wound around the external magnetic member, so that it is possible to cancel a magnetic field to be applied to the magnetosensitive element and to prevent the external magnetic member from being magnetically saturated.

9 Claims, 18 Drawing Sheets

(56) References Cited

U.S. PATENT DOCUMENTS

| | | |
|---|---|---|
| 2018/0321332 A1 | 11/2018 | Tanabe |
| 2019/0302198 A1 | 10/2019 | Masuda et al. |
| 2020/0355758 A1 | 11/2020 | Tanabe et al. |

FOREIGN PATENT DOCUMENTS

| | | |
|---|---|---|
| JP | 2018-004618 A | 1/2018 |
| JP | 2018-179738 A | 11/2018 |
| JP | 2019-132719 A | 8/2019 |
| JP | 2019-174140 A | 10/2019 |
| JP | 2019-174438 A | 10/2019 |
| WO | 2017/077870 A1 | 5/2017 |

OTHER PUBLICATIONS

Extended European Search Report dated Nov. 15, 2023 issued in the corresponding European Patent Application No. 20889844.5.

* cited by examiner

MAGNETIC SENSOR

CROSS REFERENCE TO RELATED APPLICATIONS

This application is the U.S. National Phase under 35 U.S.C. § 371 of International Application No. PCT/JP2020/029194, filed on Jul. 30, 2020, which claims the benefit of Japanese Patent Application No. 2019-211066, filed on Nov. 22, 2019, the entire contents of each are hereby incorporated by reference.

TECHNICAL FIELD

The present invention relates to a magnetic sensor and, more particularly, to a magnetic sensor having an external magnetic member for collecting magnetic flux in a magnetosensitive element and a compensating coil.

BACKGROUND ART

As a magnetic sensor having an external magnetic member for collecting magnetic flux in a magnetosensitive element and a compensating coil, magnetic sensors described in Patent Documents 1 and 2 are known. The magnetic sensors described in Patent Documents 1 and 2 have a magnetosensitive element and a compensating coil which are integrated on a sensor chip and an external magnetic member disposed on the sensor chip. A magnetic field collected by the external magnetic member is applied to the magnetosensitive element, and the magnetic field applied to the magnetosensitive element is canceled by the compensating coil, whereby so-called closed-loop control is achieved. This maintains a state where a zero magnetic field is applied to the magnetosensitive element, preventing an offset due to a temperature change, which enables accurate magnetic field measurement.

However, in the magnetic sensors described in Patent Documents 1 and 2, the compensating coil is integrated on the sensor chip, so that it is difficult to ensure a sufficient number of turns of the compensation coil and, accordingly, a magnetic field generated from the current flowing in the compensating coil is comparatively weak. Thus, when a magnetic field to be measured is comparatively strong, it is difficult to cancel a magnetic field to be applied to the magnetosensitive element. Further, the distance between the compensating coil and the external magnetic member is large, so that the external magnetic member may be magnetically saturated when a magnetic field to be measured is comparatively strong. The magnetic saturation of the external magnetic member deteriorates magnetic collection performance, with the result that linearity between the strength of a magnetic field and a sensor output is lost, which prevents accurate magnetic field measurement.

To solve the above problem, Patent Document 1 employs a method in which a large-sized compensating coil is additionally provided on a substrate mounting a sensor chip so as to surround the sensor chip (see FIG. 12 of this document). With this method, a strong canceling magnetic field can be applied to the magnetosensitive element and external magnetic member, so that even when a magnetic field to be measured is comparatively strong, it is possible to properly cancel the magnetic field to be applied to the magnetosensitive element and to prevent the external magnetic member from being magnetically saturated.

CITATION LIST

Patent Document

[Patent Document 1] Pamphlet of WO 2017/077870
[Patent Document 2] JP 2018-179738A

SUMMARY OF THE INVENTION

Problem to be Solved by the Invention

However, in the above method, the entire size of a magnetic sensor is disadvantageously increased.

It is therefore an object of the present invention to provide a small-sized magnetic sensor capable of properly canceling a magnetic field to be applied to a magnetosensitive element with a compensating coil and preventing an external magnetic member from being magnetically saturated.

Means for Solving the Problem

A magnetic sensor according to the present invention includes: a substrate; a sensor chip provided with an element formation surface having at least one magnetosensitive element formed thereon and mounted on the surface of the substrate such that the element formation surface is perpendicular to the surface of the substrate or inclined by a predetermined angle with respect to the surface of the substrate; at least one external magnetic member mounted on the surface of the substrate and collecting a magnetic field to be detected in the magnetosensitive element; and a compensating coil wound around the external magnetic member.

According to the present invention, the compensating coil is wound around the external magnetic member, so that the diameter of the coil can be reduced. This makes it possible to efficiently apply a canceling magnetic field to the external magnetic member while preventing an increase in the entire size of the magnetic sensor. Thus, the magnetic field to be applied to the magnetosensitive element can be properly canceled, and magnetic saturation of the external magnetic member can be prevented. In addition, the external magnetic member is mounted on the surface of the substrate, so that even a long external magnetic member can be stably supported on the substrate. Further, since the compensating coil need not be provided as a separate part, a change in the canceling magnetic field due to displacement of the compensating coil is reduced, allowing the sensor to be provided with a stable yield.

In the present invention, the compensating coil may be wound around the external magnetic member at a position not overlapping the substrate. This prevents unstable support of the external magnetic member caused due to contact between the compensating coil and the substrate. In this case, the external magnetic member may have a protruding part protruding from the surface of the substrate, and the compensating coil may be wound around the protruding part. Alternatively, the substrate may have a slit or an opening overlapping the external magnetic member, and the compensating coil may be disposed at a position overlapping the slit or opening. This can prevent contact between the compensating coil and the substrate.

In the present invention, the external magnetic member may have a separating part separating from the surface of the substrate, and the compensating coil may be wound at the separating part of the external magnetic member. This can prevent the compensating coil disposed at a position overlapping the substrate from contacting the substrate.

In the present invention, the compensating coil may be wound around both the external magnetic member and the substrate as one body. This can prevent the external magnetic member from being broken due to external force while preventing interference between the compensating coil and the substrate.

In the present invention, the at least one magnetosensitive element may include a plurality of bridge-connected magnetosensitive elements including first and second magnetosensitive elements, and the at least one external magnetic member may include a first external magnetic member disposed between the first and second magnetosensitive elements as viewed in a direction perpendicular to the element formation surface. This allows magnetic fields in opposite directions to be applied respectively to the first and second magnetosensitive elements. In this case, the compensating coil may be wound around the first external magnetic member. This allows a canceling magnetic field to be applied efficiently to the first external magnetic member.

In the present invention, the at least one external magnetic member may further include a second external magnetic member that covers the back surface of the sensor chip that is positioned on the side opposite to the element formation surface. This enhances the strength of a magnetic field to be applied to the magnetosensitive element. In this case, the compensating coil may be wound around the second external magnetic member. This allows a canceling magnetic field to be applied efficiently to the second external magnetic member.

In the present invention, the compensating coil may be wound around the external magnetic member through a bobbin. This eliminates the need to directly wind the compensating coil around the external magnetic member. In this case, the substrate and external magnetic member may be inserted into the inner diameter area of the bobbin. Thus, simplified manufacturing is achieved by mounting the sensor chip and external magnetic member on the substrate and then by disposing the bobbin wound with the compensating coil so as to receive insertion of the resultant substrate, thus achieving improvement in assembly workability.

Advantageous Effects of the Invention

As described above, the magnetic sensor according to the present invention can properly cancel a magnetic field to be applied to the magnetosensitive element with the compensating coil and can prevent magnetic saturation of the external magnetic member. In addition, since the compensating coil is wound around the external magnetic member, an increase in the entire size of the magnetic sensor can be prevented. Further, since the compensating coil is wound without contacting the substrate, it is possible to prevent unstable support of the external magnetic member caused due to contact between the compensating coil and substrate.

MODE FOR CARRYING OUT THE INVENTION

Hereinafter, preferred embodiments of the present invention will be described in detail with reference to the accompanying drawings.

Figure 1:
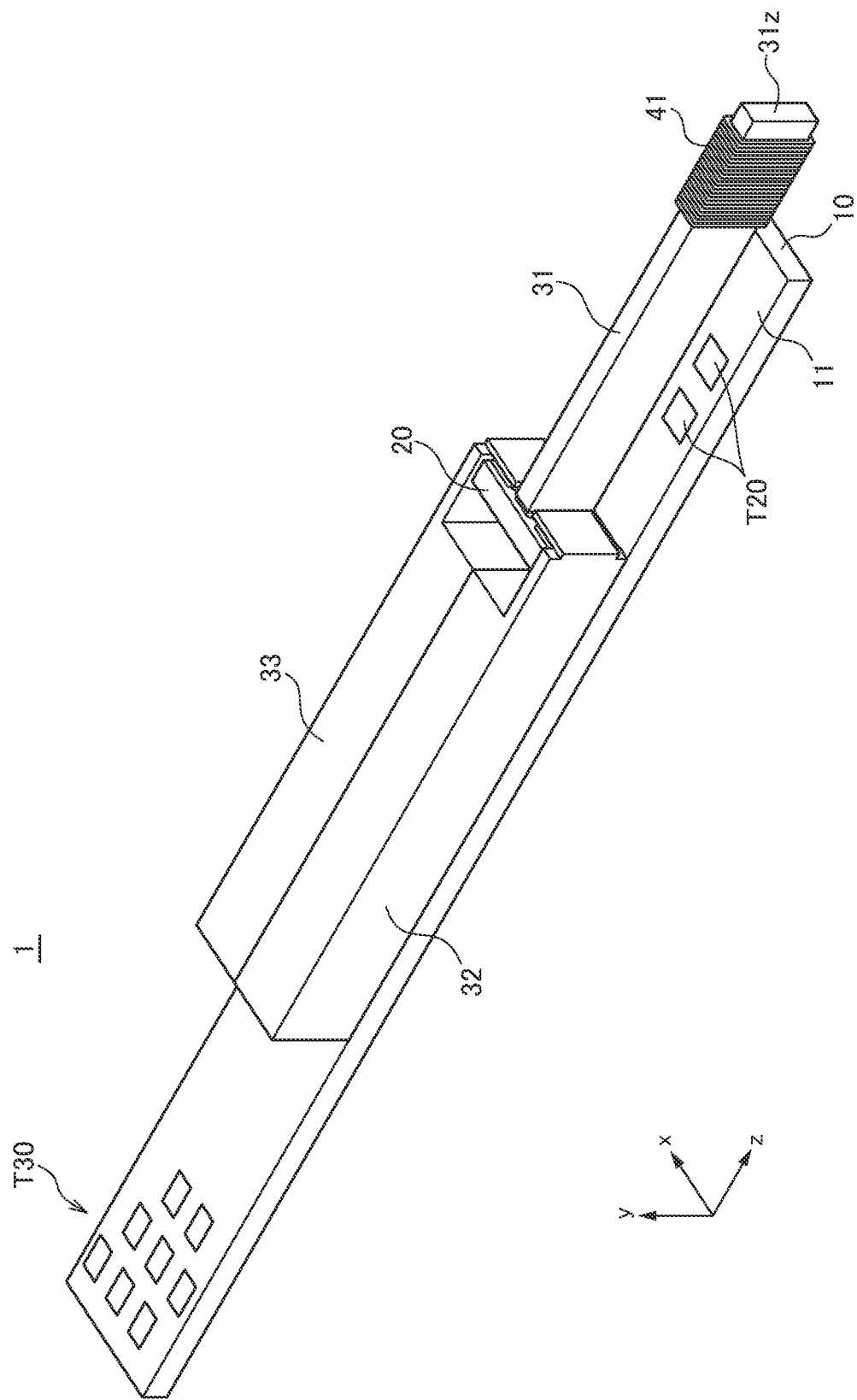
FIG. 1 is a schematic perspective view illustrating the outer appearance of a magnetic sensor 1 according to a first embodiment of the present invention.
Figure 2:
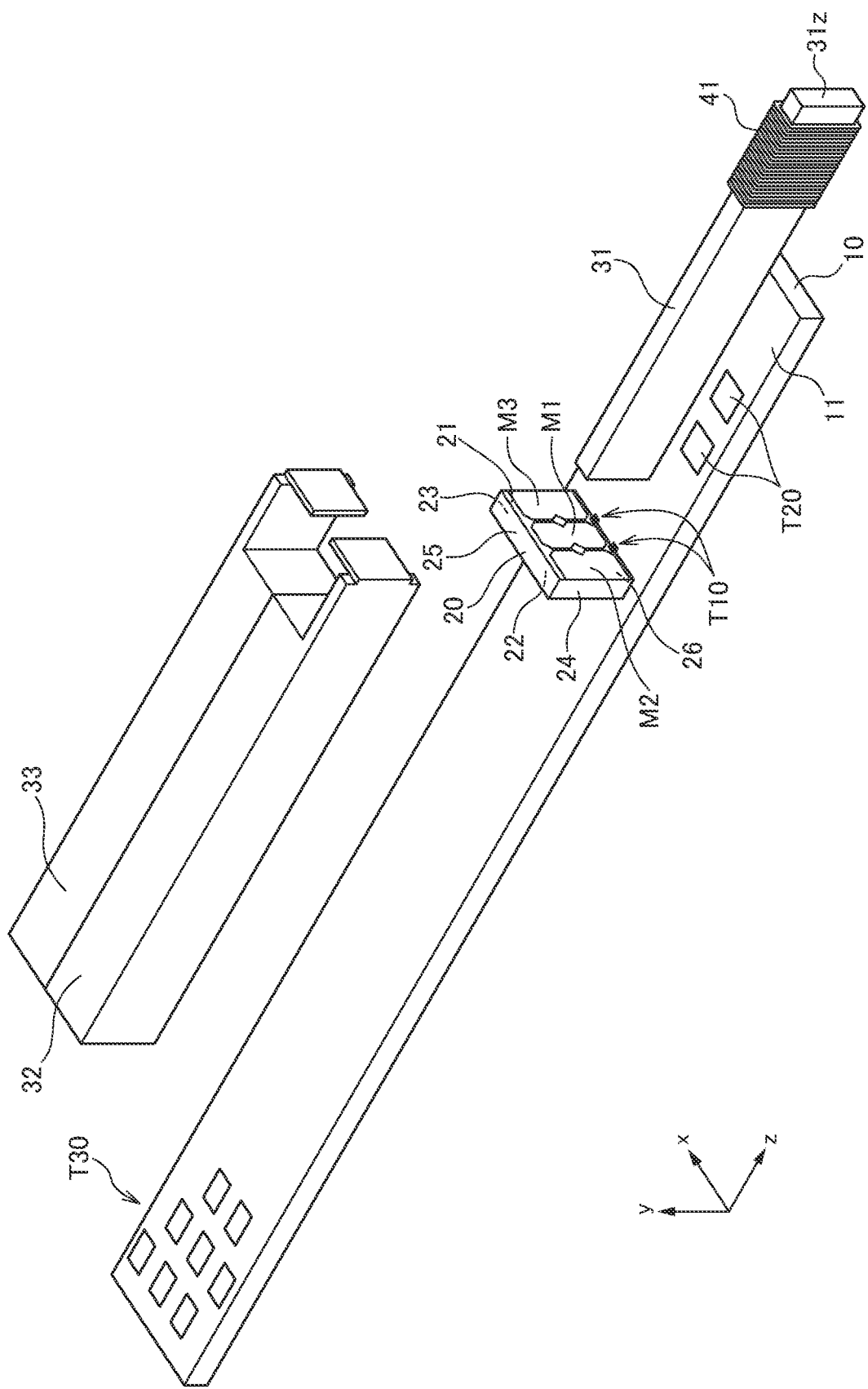
FIG. 2 is a schematic exploded perspective view of the magnetic sensor 1.

FIG. 1 is a schematic perspective view illustrating the outer appearance of a magnetic sensor 1 according to a first embodiment of the present invention. FIG. 2 is a schematic exploded perspective view of the magnetic sensor 1.

As illustrated in FIGS. 1 and 2, the magnetic sensor 1 according to the first embodiment has a substrate 10, a sensor chip 20 mounted on a surface 11 constituting the xz plane of the substrate 10, external magnetic members 31 to 33 also mounted on the surface 11 of the substrate 10, and a compensating coil 41 wound around the external magnetic member 31. The sensor chip 20 has an element formation surface 21 and a back surface 22 constituting the xy plane, side surfaces 23 and 24 constituting the yz plane, and side surfaces 25 and 26 constituting the xz plane. The sensor chip 20 is mounted on the substrate 10 such that the side surface 26 faces the surface 11 of the substrate 10. A magnetosensitive element and magnetic layers M1 to M3 to be described layer are formed on the element formation surface 21 of the sensor chip 20. Thus, in the present embodiment, the surface 11 of the substrate 10 and the element formation surface 21 of the sensor chip 20 are perpendicular to each other; however, they need not necessarily be completely perpendicular to each other and may be in predetermined tilted relation with respect to the perpendicularity.

The external magnetic members 31 to 33 collect magnetic flux in the sensor chip 20 and are made of a high permeability material such as ferrite. The external magnetic member 31 has a rod shape elongated in the z-direction and is positioned at a substantially center part of the element formation surface 21 in the x-direction so as to cover a part of the magnetic layer M1. The external magnetic member 32 covers a part of the magnetic layer M2 and also covers the side surface 24 and back surface 22 of the sensor chip 20 and has a rod shape elongated in the z-direction. Similarly, the external magnetic member 33 covers a part of the magnetic layer M3 and also covers the side surface 23 and back surface 22 of the sensor chip 20 and has a rod shape elongated in the z-direction. With this configuration, a magnetic field in the z-direction is selectively collected, and the collected magnetic field is applied to the sensor chip 20.

The compensating coil 41 is a wire (coated wire) wound around the external magnetic member 31 such that the z-direction is the axial direction thereof. As illustrated in FIGS. 1 and 2, the external magnetic member 31 has a protruding part 31z protruding in the z-direction from the substrate 10, and the compensating coil 41 is wound at the protruding part 31z. In the present embodiment, the compensating coil 41 is directly wound around the external magnetic member 31. Further, the compensating coil 41 wound around the external magnetic member 31 may be fixed with an adhesive or the like so as to prevent loosening and unwinding of the coil. The number of turns of the wire constituting the compensating coil 41 is not particularly limited and may be set to the number required to generate a target canceling magnetic field. In the present embodiment, the compensating coil 41 is wound around the external magnetic member 31, so that it is possible to significantly increase the number of turns and to allow a larger amount of current to flow as compared to a method in which the compensating coil is integrated on the sensor chip 20. Further, unlike a method in which a compensating coil is additionally disposed on the substrate, it is possible to avoid an increase in the entire size of the magnetic sensor.

Figure 3:
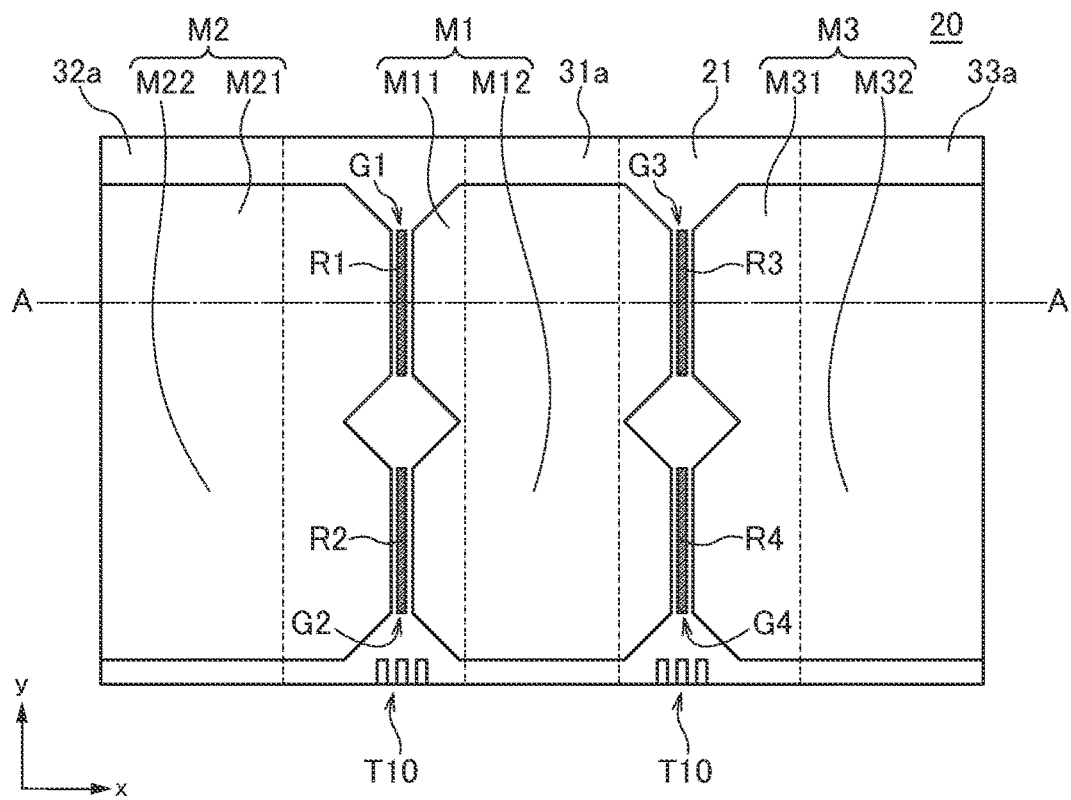
FIG. 3 is a schematic plan view of the sensor chip 20.
Figure 4:
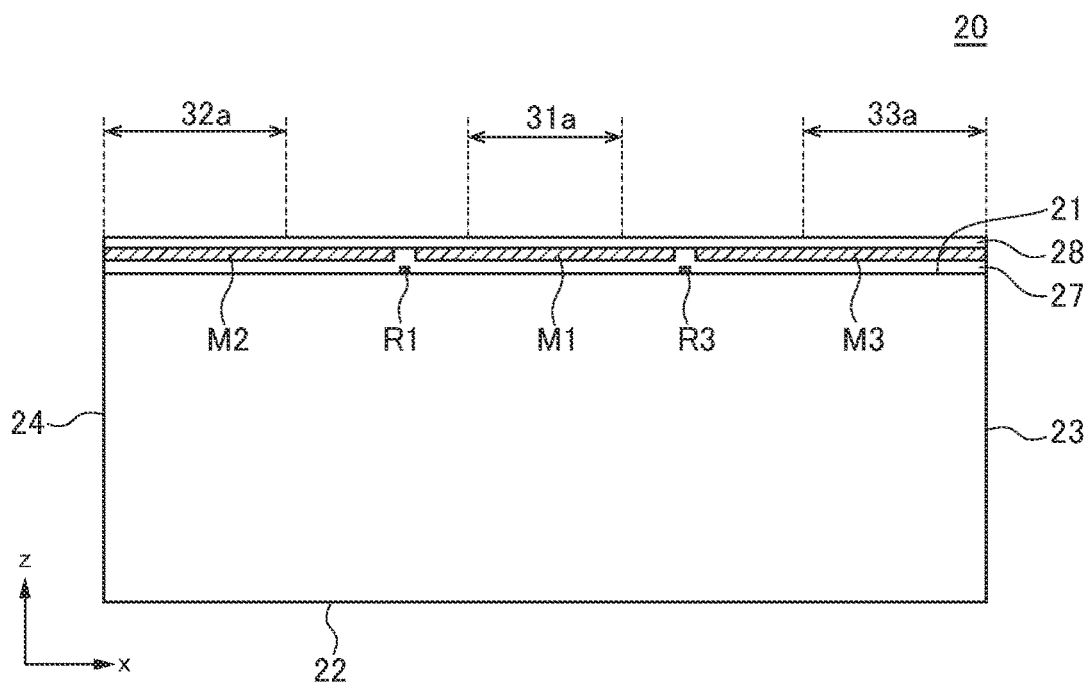
FIG. 4 is a schematic cross-sectional view taken along the line A-A in FIG. 3.

FIG. 3 is a schematic plan view of the sensor chip 20, and FIG. 4 is a schematic cross-sectional view taken along the line A-A in FIG. 3.

As illustrated in FIGS. 3 and 4, the sensor chip 20 has four magnetosensitive elements R1 to R4 on the element formation surface 21 of the sensor chip 20. The magnetosensitive elements R1 to R4 are not particularly limited in type as long as the electric resistance therein changes according to the direction of magnetic flux and may be, for example, MR elements or the like. The magnetosensitive elements R1 to R4 have the same fixed magnetization direction (for example, positive side in the x-direction). The magnetosensitive elements R1 to R4 are covered with an insulating layer 27, and the magnetic layers M1 to M3 made of permalloy are formed on the surface of the insulating layer 27. The magnetic layers M1 to M3 are covered with an insulating layer 28. As illustrated in FIG. 3, parts of the respective magnetic layers M1 to M3 that are positioned on one side (upper side) in the y-direction are defined as magnetic layers M11, M21, and M31, and parts thereof that are positioned on the other side (lower side) in the y-direction are defined as magnetic layers M12, M22, and M32. In this case, in a plan view (as viewed in the z-direction), the magnetosensitive element R1 is positioned between the magnetic layers M11 and M21, the magnetosensitive element R2 is positioned between the magnetic layers M12 and M22, the magnetosensitive element R3 is positioned between the magnetic layers M11 and M31, and the magnetosensitive element R4 is positioned between the magnetic layers M12 and M32. As a result, magnetic fields passing through respective magnetic gaps G1 to G4 are applied to the magnetosensitive elements R1 to R4, respectively.

Figure 5:
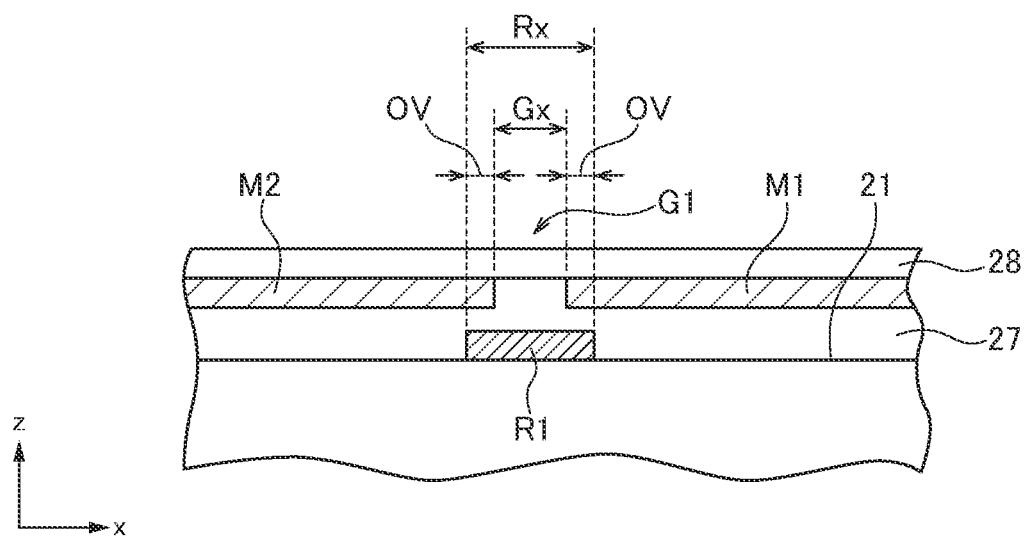
FIG. 5 is a schematic cross-sectional view for explaining an example in which the magnetic layers overlap the magnetosensitive element.

However, in the present invention, each of the magnetosensitive elements R1 to R4 need not necessarily be positioned between two magnetic layers in a plan view, and they may each be positioned in the vicinity of the magnetic gap (G1 to G4) formed by two magnetic layers, i.e., on a magnetic path formed by the magnetic gap (G1 to G4). Further, the widths of the magnetic gaps G1 to G4 need not be larger than those of the magnetosensitive elements R1 to R4 and may be smaller than those thereof. In the example illustrated in FIG. 5, a width Gx of the magnetic gap G1 in the x-direction is smaller than a width Rx of the magnetosensitive element R1 in the x-direction, so that the magnetic layers M1 and M2 each overlap the magnetosensitive element R1 by a dimension OV as viewed in the z-direction. The relation between the magnetic gaps G1 to G4 and the magnetosensitive elements R1 to R4 may be as illustrated in FIG. 5.

In FIGS. 3 and 4, reference numerals 31a to 33a denote areas covered with the external magnetic members 31 to 33, respectively. As illustrated in FIGS. 3 and 4, the external magnetic member 31 covers the magnetic layer M1, the external magnetic member 32 covers the magnetic layer M2, and the external magnetic member 33 covers the magnetic layer M3.

Figure 6:
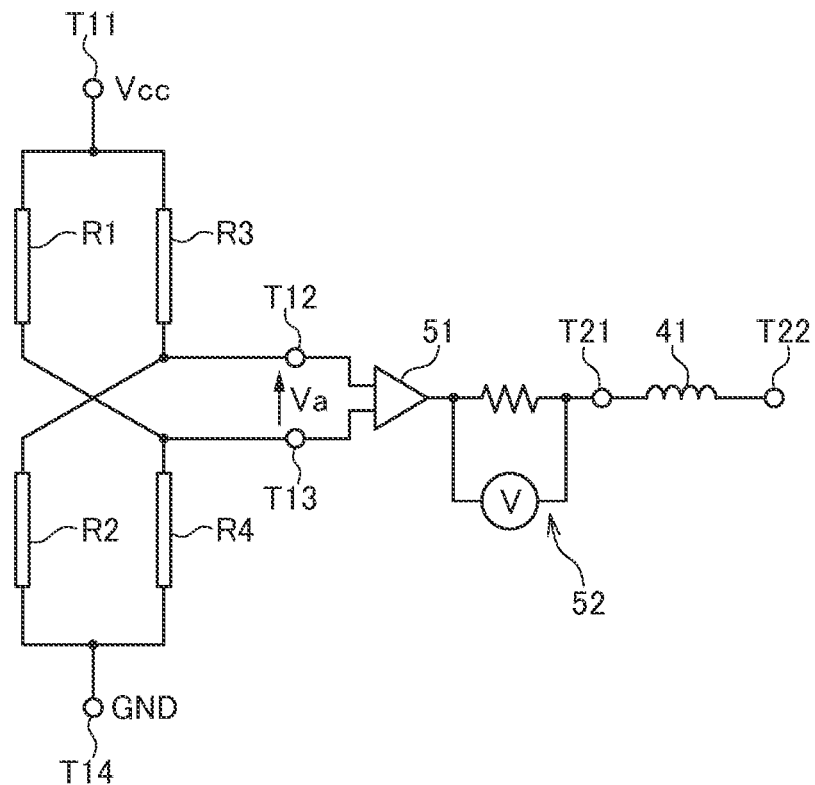
FIG. 6 is a circuit diagram for explaining the connection relation between the magnetosensitive elements R1 to R4 and the compensating coil 41.

FIG. 6 is a circuit diagram for explaining the connection relation between the magnetosensitive elements R1 to R4 and the compensating coil 41.

As illustrated in FIG. 6, the magnetosensitive element R1 is connected between terminal electrodes T11 and T13, the magnetosensitive element R2 is connected between terminal electrodes T12 and T14, the magnetosensitive element R3 is connected between the terminal electrodes T11 and T12, and the magnetosensitive element R4 is connected between the terminal electrodes T13 and T14. The terminal electrodes T11 to T14 constitute a terminal electrode group T10 illustrated in FIG. 2. The terminal electrode group T10 is provided on the sensor chip and connected to a terminal electrode group T30 illustrated in FIGS. 1 and 2 through not-shown wiring formed in the substrate 10. The terminal electrode T11 is applied with a power supply potential Vcc, and the terminal electrode T14 is applied with a ground potential GND. Since the magnetosensitive elements R1 to R4 have the same fixed magnetization direction, there occurs a difference between the amount of resistance change in the magnetosensitive elements R1 and R2 positioned on one side as viewed from the external magnetic member 31 and that in the magnetosensitive elements R3 and R4 positioned on the other side as viewed from the external magnetic member 31. Thus, the magnetosensitive elements R1 to R4 constitute a differential bridge circuit, and a change in the electric resistance in the magnetosensitive elements R1 to R4 according to magnetic flux density appears between the terminal electrodes T12 and T13 as a differential signal Va.

The differential signal Va between the terminal electrodes T12 and T13 is input to a differential amplifier 51 provided in the substrate 10 or sensor chip 20. An output signal from the differential amplifier 51 is fed back to a terminal electrode T21. As illustrated in FIG. 6, the compensating coil 41 is connected between terminal electrodes T21 and T22, whereby the compensating coil 41 generates a canceling magnetic field according to the output signal from the differential amplifier 51. The terminal electrodes T21 and T22 constitute a terminal electrode group T20 illustrated in FIGS. 1 and 2. Thus, when the differential signal Va corresponding to a change in the electric resistance in the magnetosensitive elements R1 to R4 according to the magnetic flux density of a magnetic field to be detected appears in the terminal electrodes T12 and T13, a corresponding current flows in the compensating coil 41 to generate a canceling magnetic field in the opposite direction, whereby the magnetic field to be detected is canceled. Then, by converting the current output from the differential amplifier 51 into voltage using a detection circuit 52, the strength of the magnetic field to be detected can be detected. By such closed-loop control, the magnetic field collected through the external magnetic members 31 to 33 can be detected with high accuracy.

In the present embodiment, the compensating coil 41 is wound around the external magnetic member 31, thus allowing a sufficient number of turns to be ensured and a larger amount of current to flow. This can generate a strong canceling magnetic field, so that even when a magnetic field to be measured is relatively strong, it is possible to properly cancel the magnetic field to be applied to the magnetosensitive elements R1 to R4 and to prevent the external magnetic member 31 from being magnetically saturated.

In addition, in the present embodiment, the external magnetic member 31 has the protruding part 31z, and the compensating coil 41 is wound at the protruding part 31z, thereby preventing contact or interference between the compensating coil 41 and the substrate 10. This allows the external magnetic member 31 to be tightly fitted to the surface 11 of the substrate 10, thus achieving stable fixation therebetween.

Figure 7:
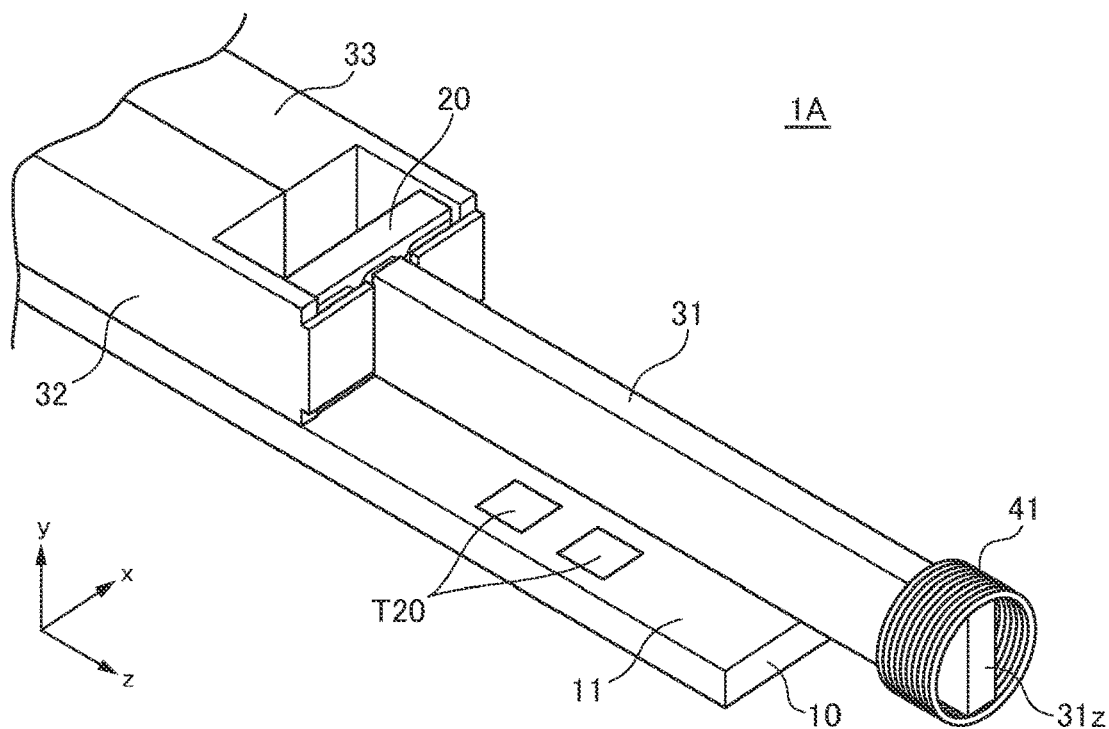
FIG. 7 is a schematic perspective view illustrating the outer appearance of a magnetic sensor 1A according to a first modification of the first embodiment.

FIG. 7 is a schematic perspective view illustrating the outer appearance of a magnetic sensor 1A according to a first modification of the present embodiment. As illustrated in FIG. 7, the magnetic sensor 1A according to the first modification differs from the above-described magnetic sensor 1 in that the compensating coil 41 is a circular air-core coil. Using such an air-core coil as the compensating coil 41 eliminates the need to directly wind the compensating coil 41 around the external magnetic member 31. That is, it is only necessary to fit the compensating coil 41 that has already been wound to the external magnetic member 31, simplifying a coil mounting process.

Figure 8:
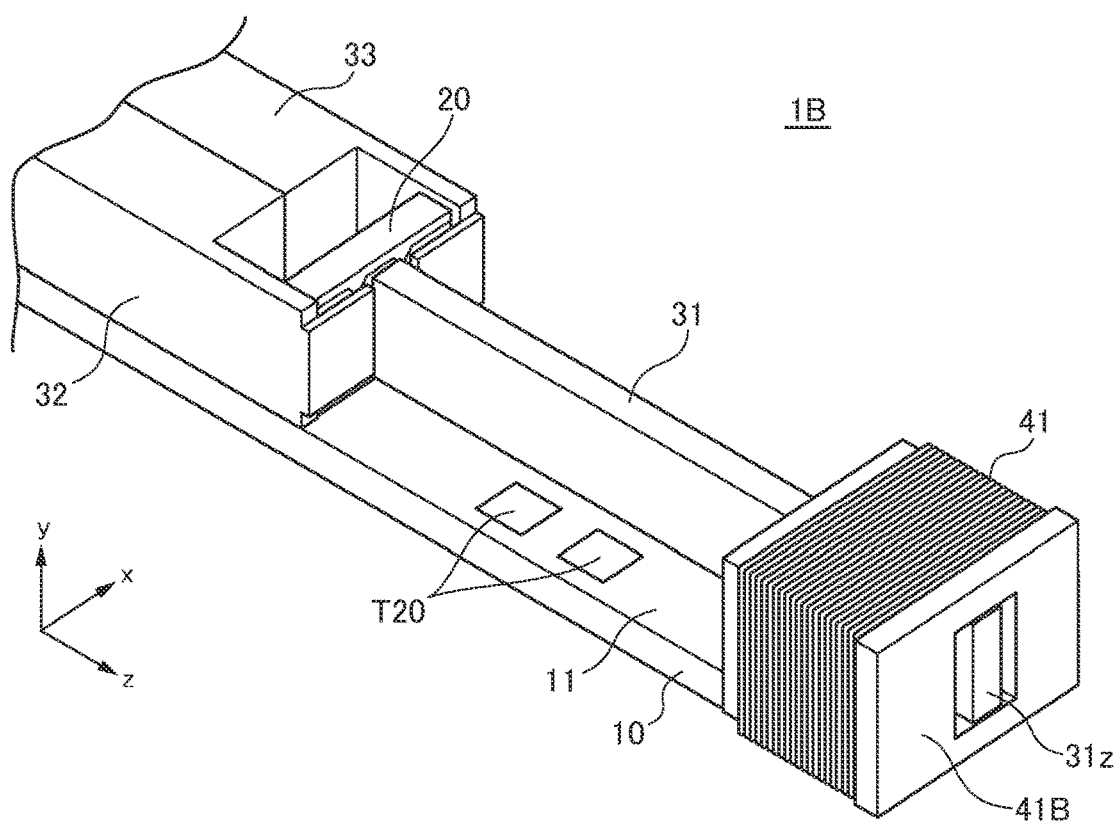
FIG. 8 is a schematic perspective view illustrating the outer appearance of a magnetic sensor 1B according to a second modification of the first embodiment.

FIG. 8 is a schematic perspective view illustrating the outer appearance of a magnetic sensor 1B according to a second modification of the present embodiment. As illustrated in FIG. 8, the magnetic sensor 1B according to the second modification differs from the above-described magnetic sensor 1 in that the compensating coil 41 is wound around the external magnetic member 31 through a bobbin 41B made of resin or the like. Thus winding the compensating coil 41 around the bobbin 41B eliminates the need to directly wind the compensating coil 41 around the external magnetic member 31. That is, it is only necessary to fit the compensating coil 41 that has already been wound around the bobbin 41B to the external magnetic member 31, simplifying a coil mounting process.

Figure 9:
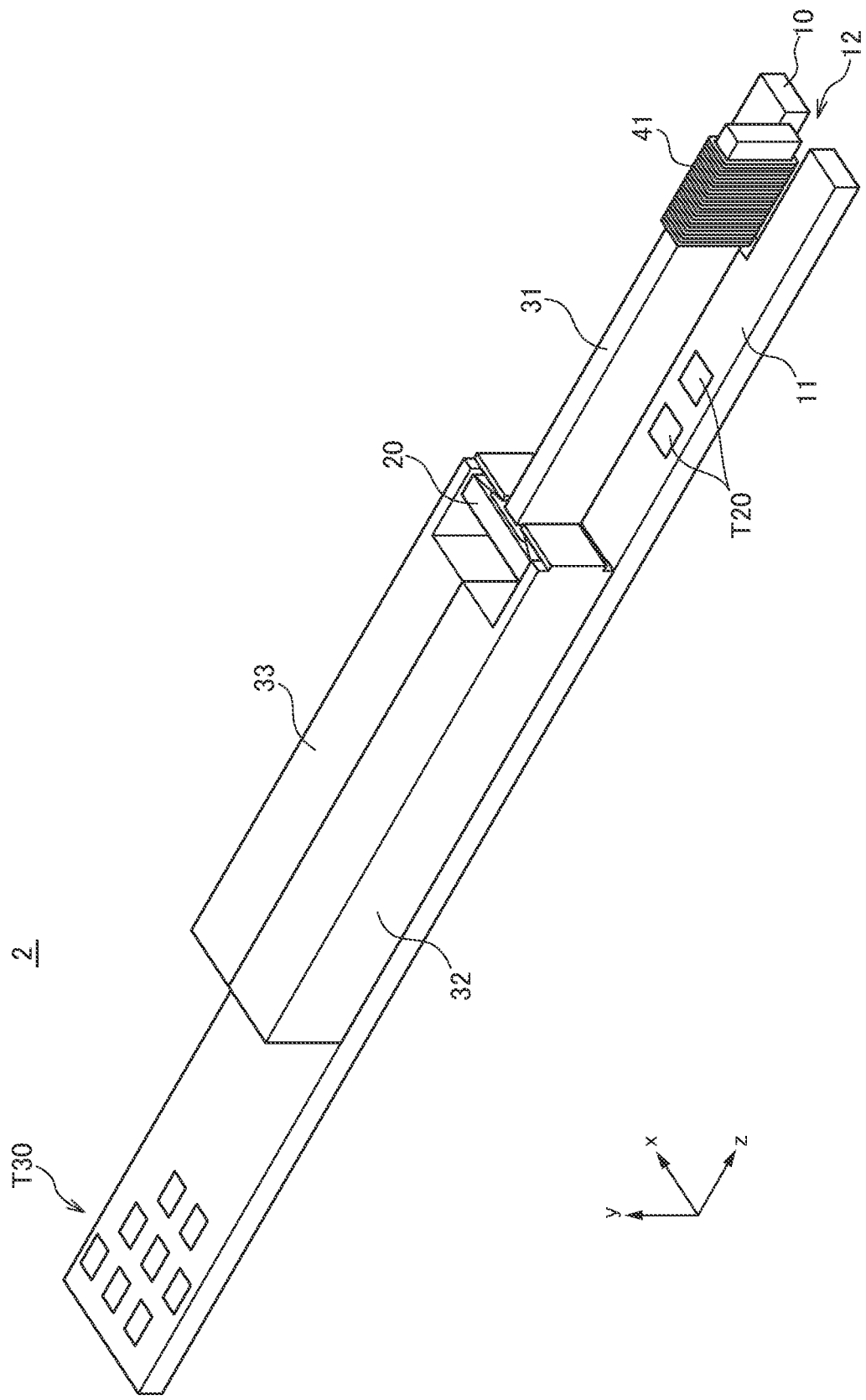
FIG. 9 is a schematic perspective view illustrating the outer appearance of a magnetic sensor 2 according to a second embodiment of the present invention.

FIG. 9 is a schematic perspective view illustrating the outer appearance of a magnetic sensor 2 according to a second embodiment of the present invention.

As illustrated in FIG. 9, the magnetic sensor 2 according to the second embodiment differs from the magnetic sensor 1 according to the first embodiment in that the substrate 10 has a slit 12. The "slit" refers to an unclosed cut, that is, the inner wall surfaces thereof are continuously connected to the side surface of the substrate 10. The slit 12 overlaps the external magnetic member 31 as viewed in the y-direction, and the compensating coil 41 is wound at a part of the external magnetic member 31 that overlaps the slit 12. Other basic configurations are the same as those of the magnetic sensor 1 according to the first embodiment, so the same reference numerals are given to the same elements, and overlapping description will be omitted.

In the present embodiment, although the external magnetic member 31 does not protrude from the substrate 10, the compensating coil 41 is wound at a part of the external magnetic member 31 that overlaps the slit 12 formed in the substrate 10, so that the compensating coil 41 and the substrate 10 do not contact each other as in the first embodiment. In addition, the external magnetic member 31 does not protrude from the substrate 10, making the external magnetic member 31 less likely to be broken even in case of external force being applied.

Figure 10:
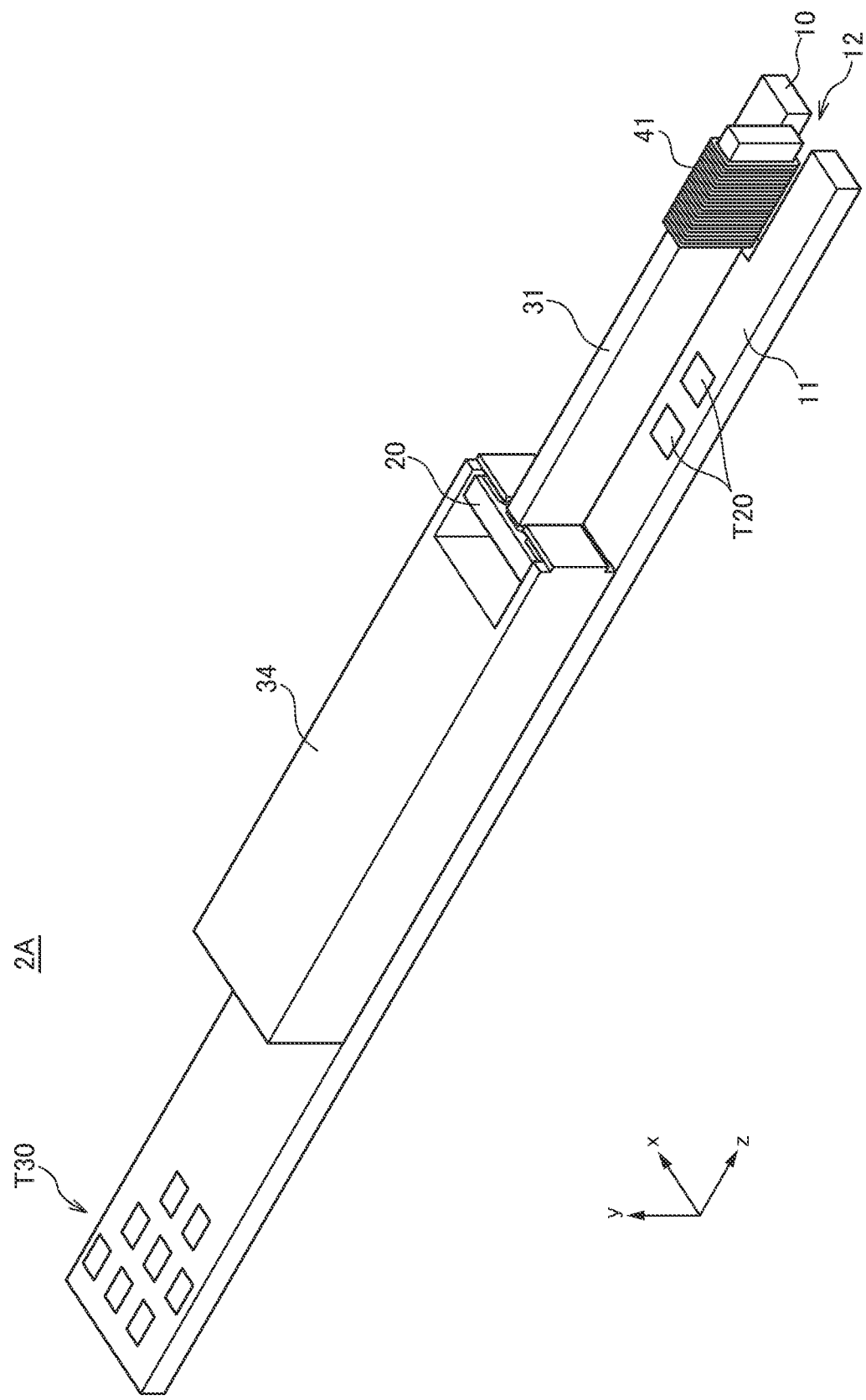
FIG. 10 is a schematic perspective view illustrating the outer appearance of a magnetic sensor 2A according to a modification of the second embodiment.

FIG. 10 is a schematic perspective view illustrating the outer appearance of a magnetic sensor 2A according to a modification of the present embodiment. As illustrated in FIG. 10, the magnetic sensor 2A according to the modification is configured such that the external magnetic members 32 and 33 are not separate parts but integrated with each other as one external magnetic member 34. As exemplified by the present modification, the external magnetic members 32 and 33 may be integrated as one external magnetic member 34.

Figure 11:
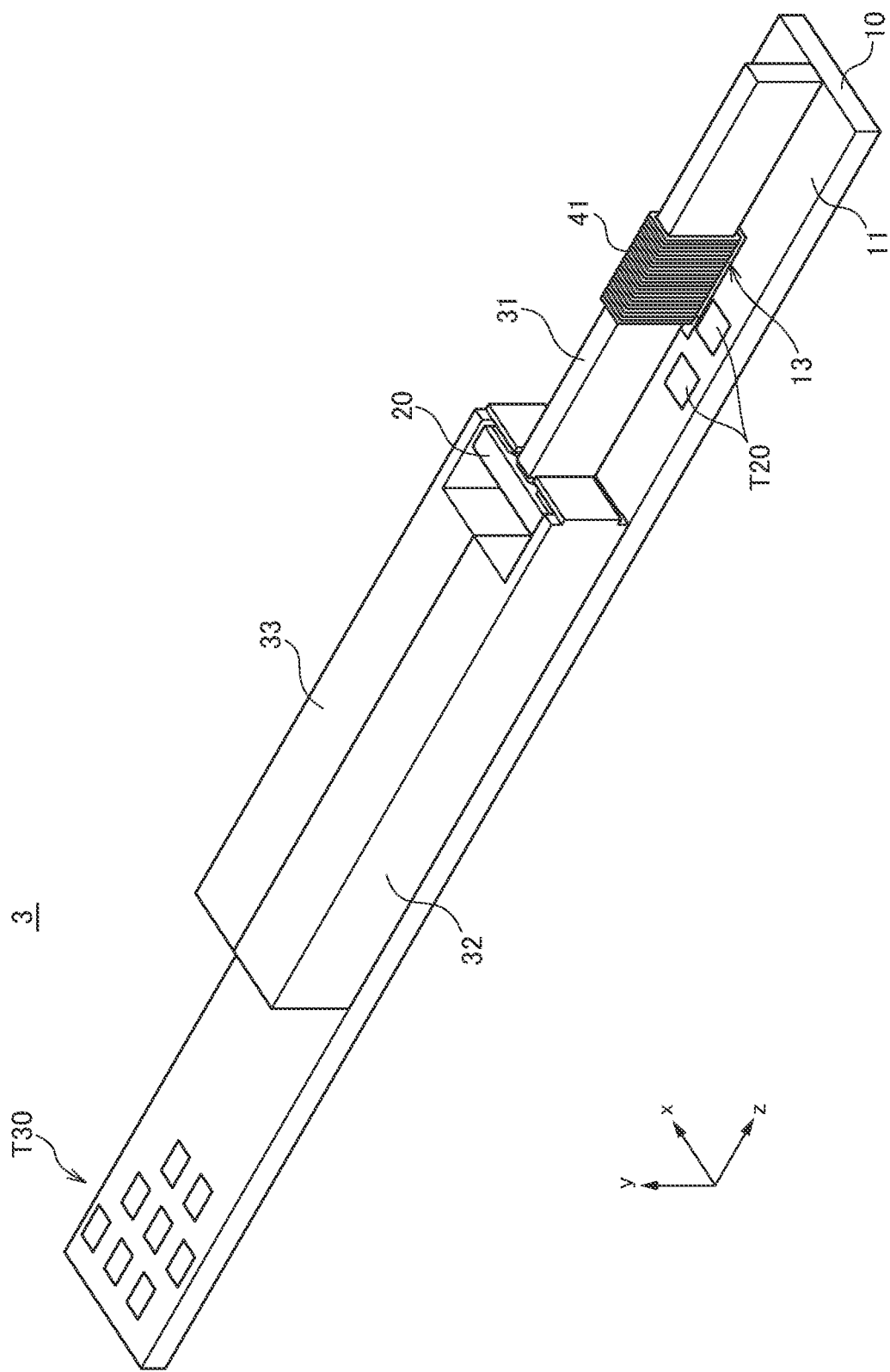
FIG. 11 is a schematic perspective view illustrating the outer appearance of a magnetic sensor 3 according to a third embodiment of the present invention.

FIG. 11 is a schematic perspective view illustrating the outer appearance of a magnetic sensor 3 according to a third embodiment of the present invention.

As illustrated in FIG. 11, the magnetic sensor 3 according to the third embodiment differs from the magnetic sensor 2 according to the second embodiment in that the substrate 10 has an opening 13. The "opening" refers to a closed cut, that is, the inner wall surfaces thereof are not continuously connected to the side surface of the substrate 10. The opening 13 overlaps the external magnetic member 31 as viewed in the y-direction, and the compensating coil 41 is wound at a part of the external magnetic member 31 that overlaps the opening 13. Other basic configurations are the same as those of the magnetic sensor 2 according to the second embodiment, so the same reference numerals are given to the same elements, and overlapping description will be omitted.

In the present embodiment, although the external magnetic member 31 does not protrude from the substrate 10, the compensating coil 41 is wound at a part of the external magnetic member 31 that overlaps the opening 13 formed in the substrate 10, so that the compensating coil 41 and the substrate 10 do not contact each other as in the first embodiment. In addition, the external magnetic member 31 does not protrude from the substrate 10, making the external magnetic member 31 less likely to be broken even in case of external force being applied. Further, a change in the formation position of the opening 13 in the z-direction allows the compensating coil 41 to be wound at a desired z-direction position.

Figure 12:
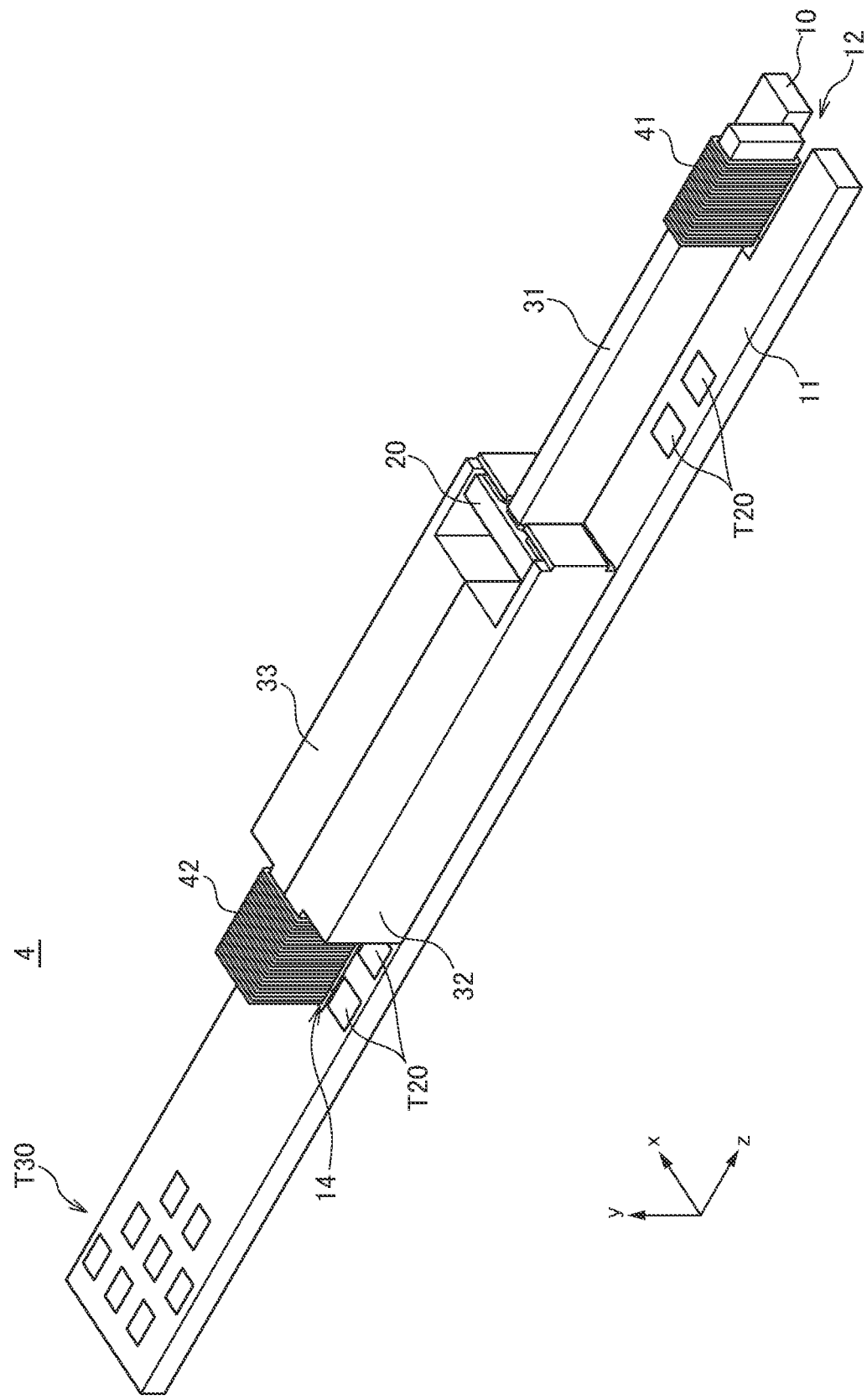
FIG. 12 is a schematic perspective view illustrating the outer appearance of a magnetic sensor 4 according to a fourth embodiment of the present invention.

FIG. 12 is a schematic perspective view illustrating the outer appearance of a magnetic sensor 4 according to a fourth embodiment of the present invention.

As illustrated in FIG. 12, the magnetic sensor 4 according to the fourth embodiment differs from the magnetic sensor 2 according to the second embodiment in that the x-direction widths of the external magnetic members 32 and 33 are narrowed at their end portions and that another compensating coil 42 is wound at the narrowed width portions. Further, the substrate 10 has not only the slit 12 but also an opening 14. Other basic configurations are the same as those of the magnetic sensor 2 according to the second embodiment, so the same reference numerals are given to the same elements, and overlapping description will be omitted.

The opening 14 overlaps the external magnetic members and 33 as viewed in the y-direction, and the compensating coil 42 is wound at a part of the external magnetic members 32 and 33 that overlaps the opening 14. The compensating coil 42 has a coil axis extending in the z-direction and wound in the same direction as the compensating coil 41 wound around the external magnetic member 31. The compensating coils 41 and 42 are preferably connected in series. The series connection between the compensating coils 41 and 41 makes the same compensating current flow in the compensating coils 41 and 42, so that the magnetic flux passing through the external magnetic member 31 is canceled by the compensating coil 41, and the magnetic flux passing through the external magnetic members 32 and 33 is canceled by the compensating coil 42. This prevents magnetic saturation of not only the external magnetic member 31 but also the external magnetic members 32 and 33.

Figure 13:
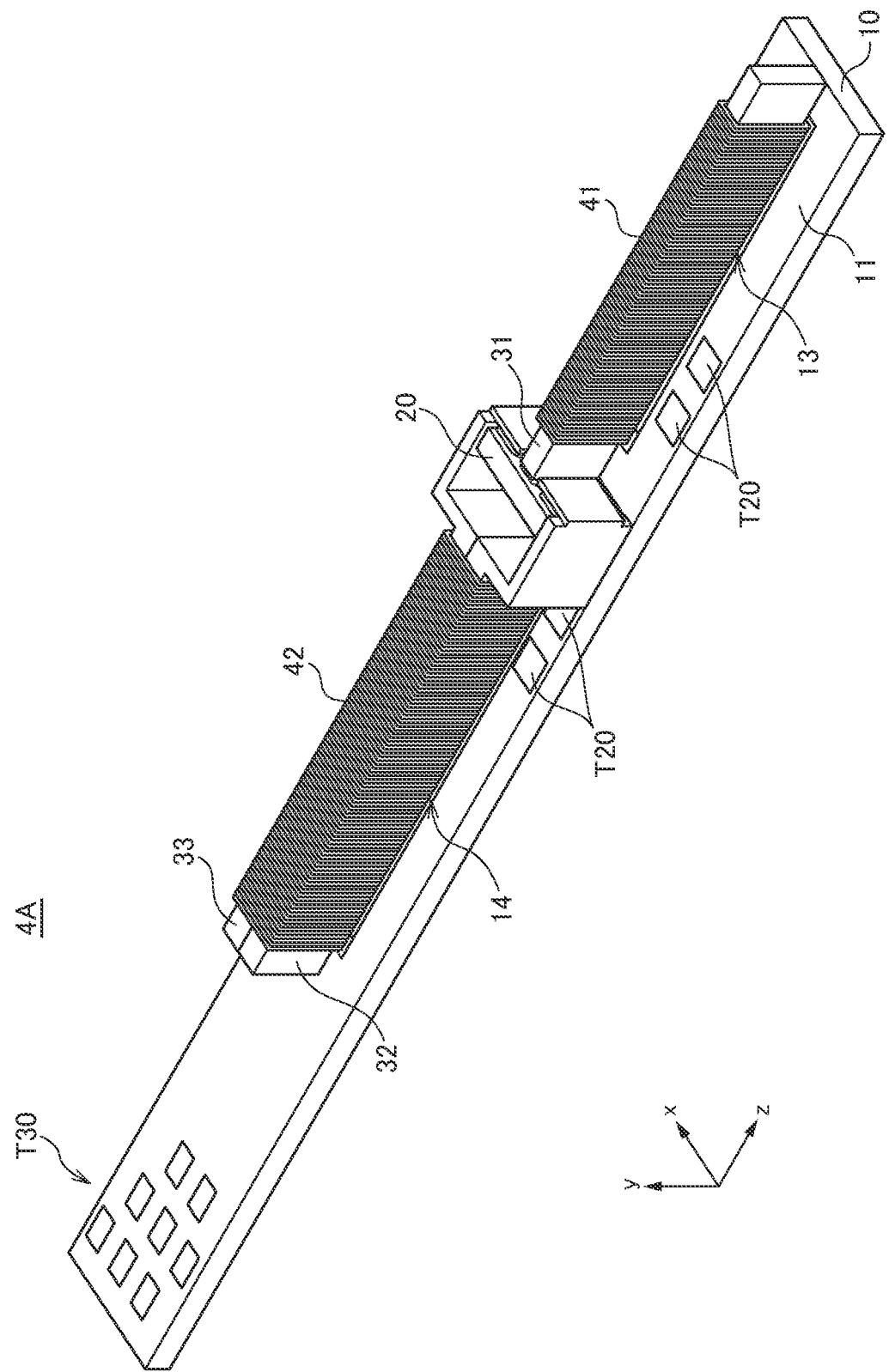
FIG. 13 is a schematic perspective view illustrating the outer appearance of a magnetic sensor 4A according to a modification of the fourth embodiment.

FIG. 13 is a schematic perspective view illustrating the outer appearance of a magnetic sensor 4A according to a modification of the present embodiment. As illustrated in FIG. 13, the magnetic sensor 4A according to the modification is configured such that the opening 13 is formed in place of the slit 12 and that the compensating coil 41 is wound at a part of the external magnetic member 31 that overlaps the opening 13. Further, the lengths of the openings 13 and 14 in the z-direction are increased and, accordingly, the numbers of turns of the compensating coils 41 and 42 are increased. Thus, when there is a need to increase the numbers of turns of the compensating coils 41 and 42, the z-direction lengths of the openings 13 and 14 may be increased.

Figure 14:
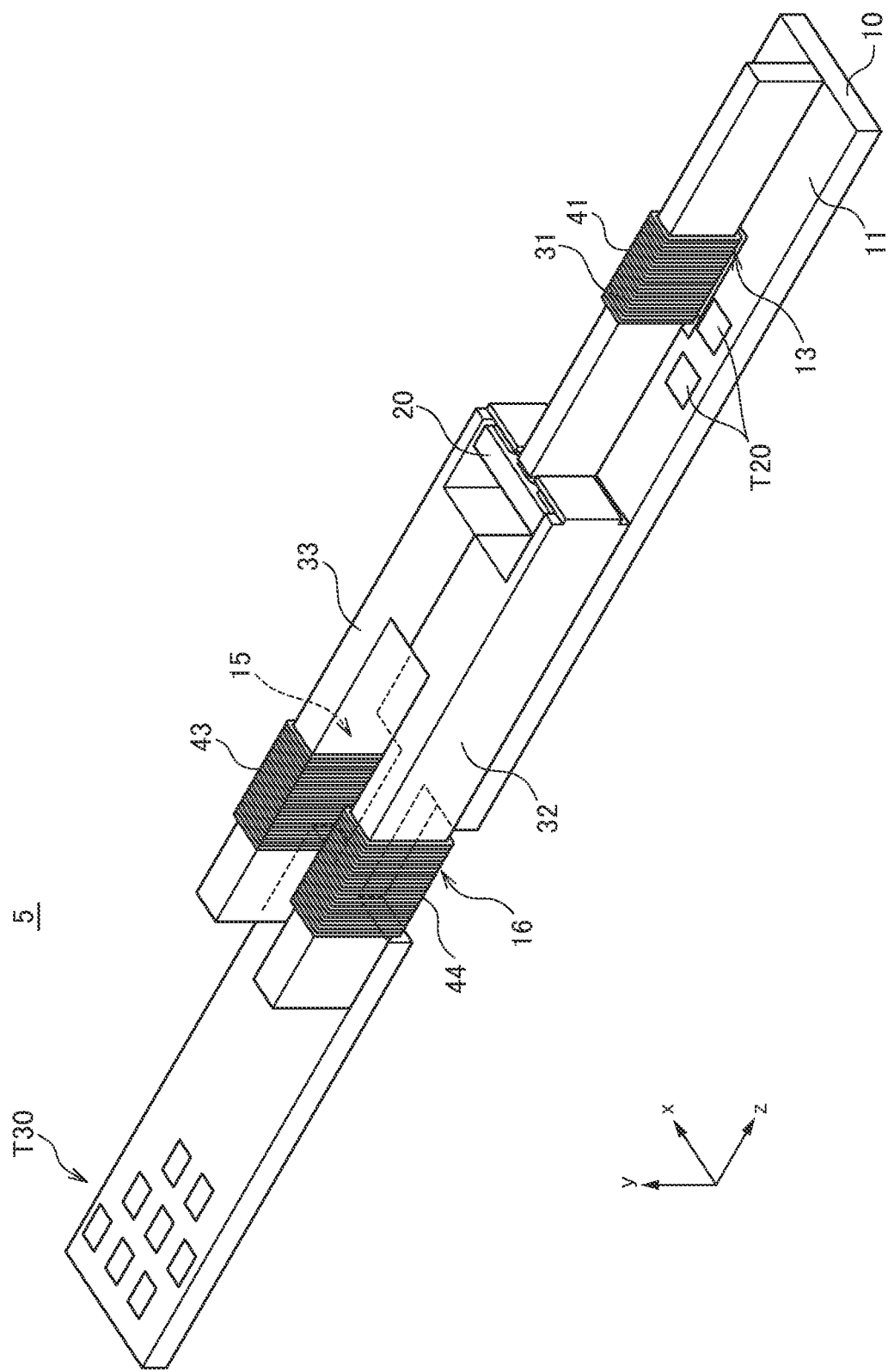
FIG. 14 is a schematic perspective view illustrating the outer appearance of a magnetic sensor 5 according to a fifth embodiment of the present invention.

FIG. 14 is a schematic perspective view illustrating the outer appearance of a magnetic sensor 5 according to a fifth embodiment of the present invention.

As illustrated in FIG. 14, the magnetic sensor 5 according to the fifth embodiment is configured such that: the opening 13 is formed in place of the slit 12; slits 15 and 16 are formed in the substrate 10; a compensating coil 43 is wound at a part of the external magnetic member 32 that overlaps the slit 15; and a compensating coil 44 is wound at a part of the external magnetic member 33 that overlaps the slit 16. Other basic configurations are the same as those of the magnetic sensor 4 according to the fourth embodiment, so the same reference numerals are given to the same elements, and overlapping description will be omitted.

As exemplified by the present embodiment, when the compensating coil is wound around the external magnetic members 32 and 33, it is not necessary to wind the compensating coil 42 around the external magnetic members 32 and 33 as one body; instead, the compensating coils 43 and 44 may be wound around the external magnetic members 32 and 33, respectively. This allows the number of turns of the compensating coil to be adjusted more finely.

Figure 15:
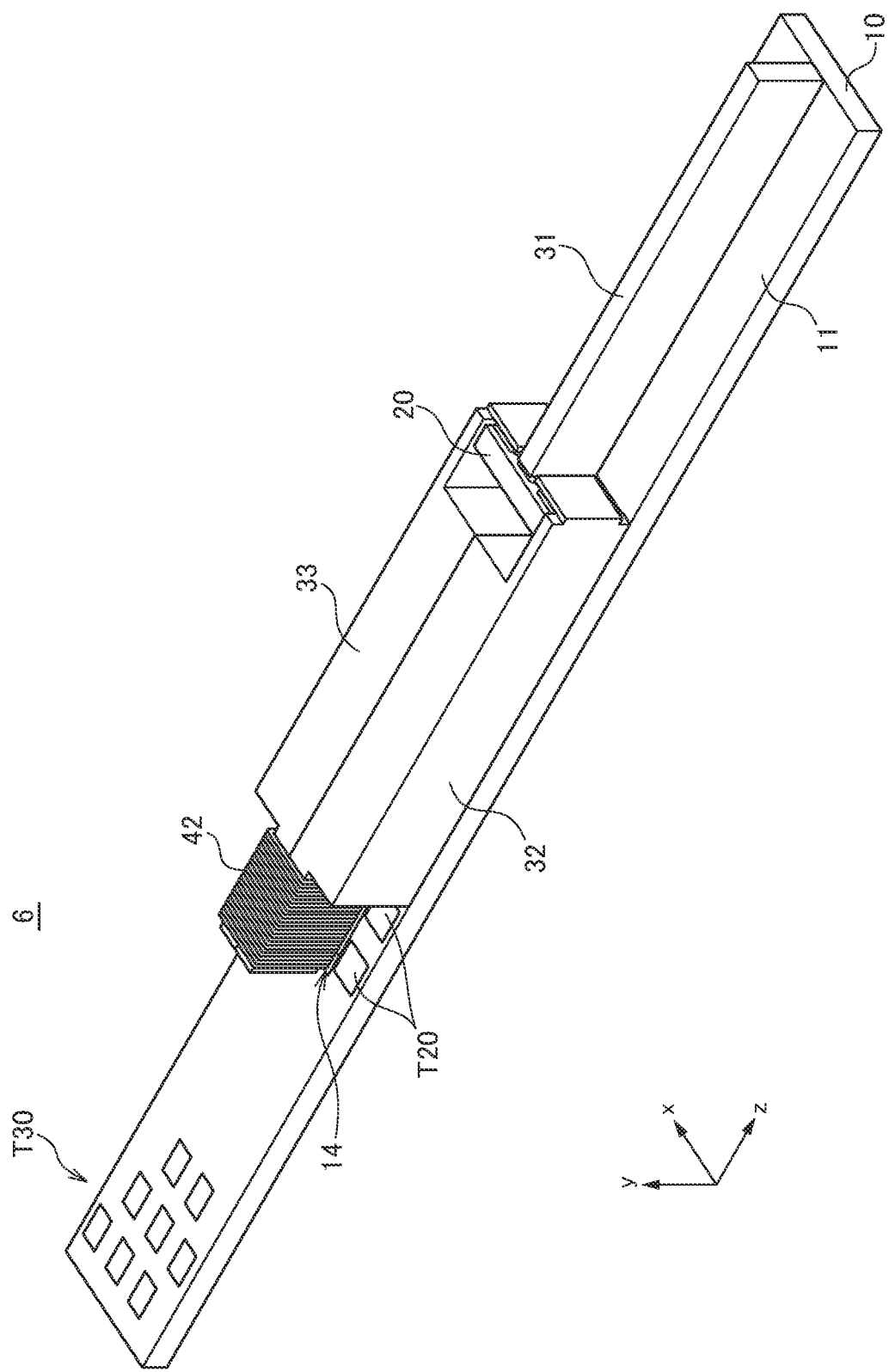
FIG. 15 is a schematic perspective view illustrating the outer appearance of a magnetic sensor 6 according to a sixth embodiment of the present invention.

FIG. 15 is a schematic perspective view illustrating the outer appearance of a magnetic sensor 6 according to a sixth embodiment of the present invention.

As illustrated in FIG. 15, the magnetic sensor 6 according to the sixth embodiment differs from the magnetic sensor 4 according to the fourth embodiment in that the compensating coil 41 is omitted. Correspondingly, the slit in the substrate 10 is also omitted. Other basic configurations are the same as those of the magnetic sensor 4 according to the fourth embodiment, so the same reference numerals are given to the same elements, and overlapping description will be omitted.

As exemplified by the present embodiment, it is not essential that the compensating coil 41 is wound around the external magnetic member 31 and, in place of omitting the compensating coil 41, the compensating coil 42 may be wound around the external magnetic members 32 and 33.

Figure 16:
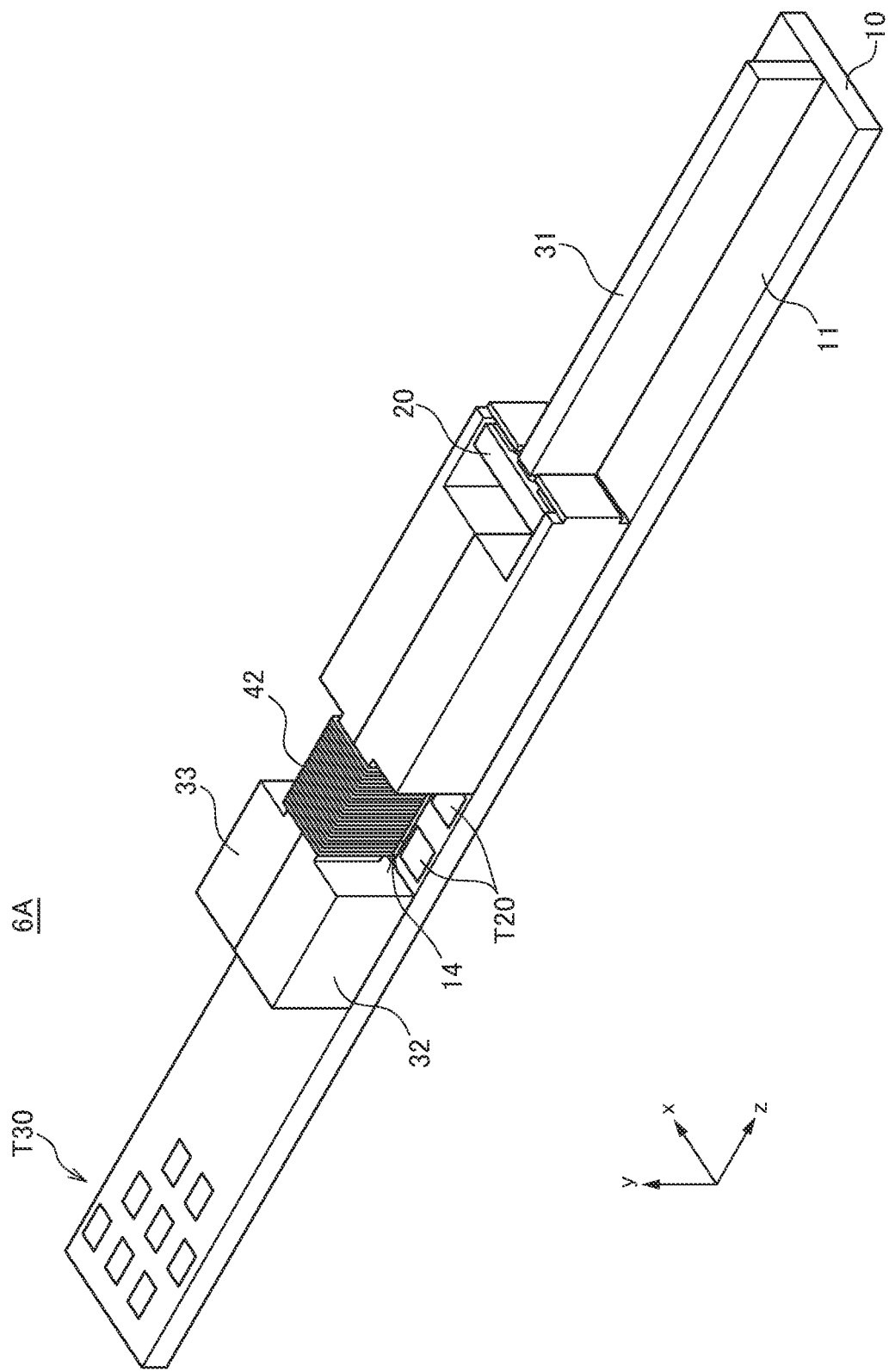
FIG. 16 is a schematic perspective view illustrating the outer appearance of a magnetic sensor 6A according to a modification of the sixth embodiment.

FIG. 16 is a schematic perspective view illustrating the outer appearance of a magnetic sensor 6A according to a modification of the present embodiment. As illustrated in FIG. 16, the magnetic sensor 6A according to the modification is configured such that the x-direction width of each of the external magnetic members 32 and 33 is narrowed at the middle portion thereof in the longitudinal direction and that the compensating coil 42 is wound at the narrowed portions. This makes the compensating coil 42 less likely to come off.

Figure 17:
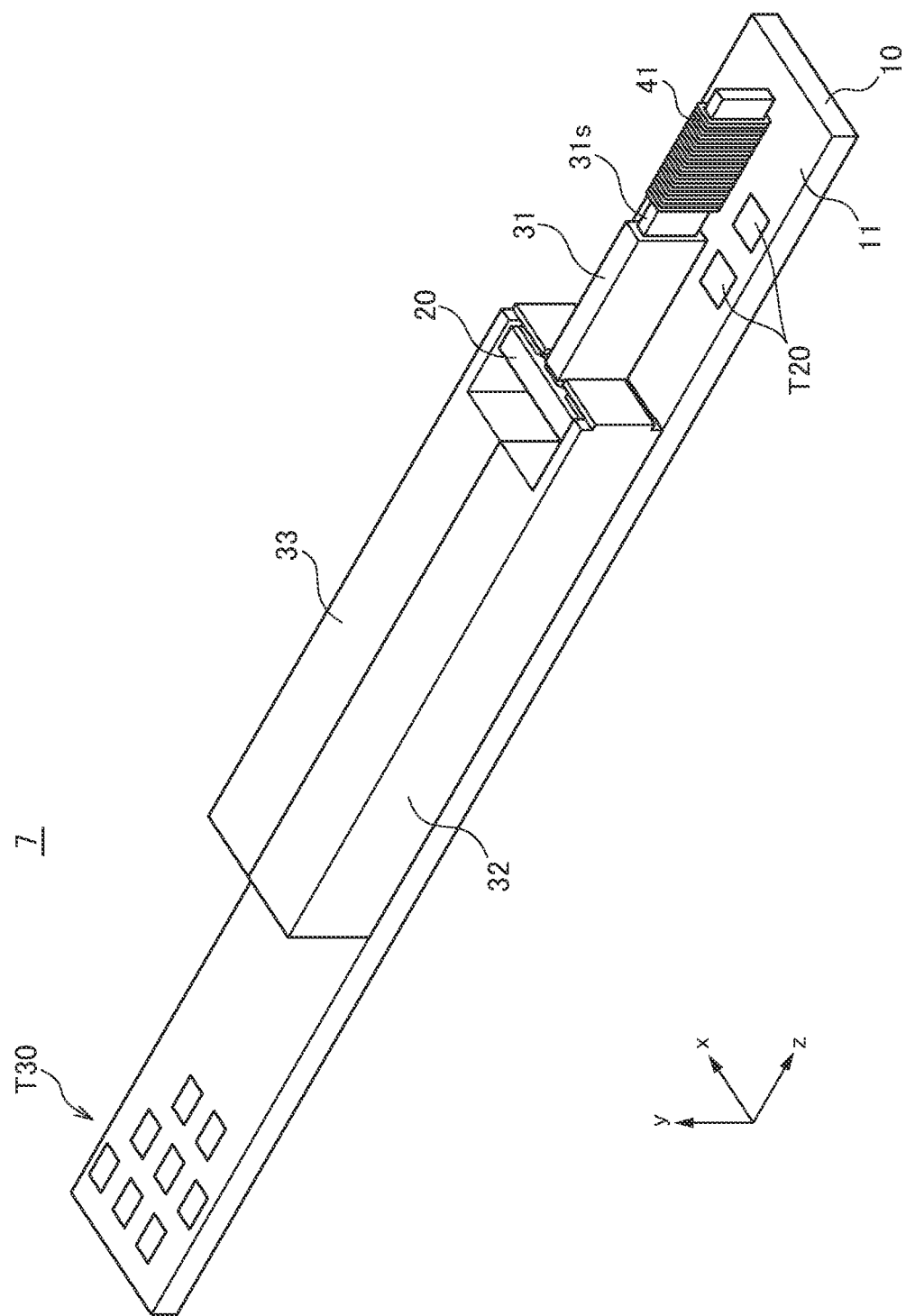
FIG. 17 is a schematic perspective view illustrating the outer appearance of a magnetic sensor 7 according to a seventh embodiment of the present invention.

FIG. 17 is a schematic perspective view illustrating the outer appearance of a magnetic sensor 7 according to a seventh embodiment of the present invention.

As illustrated in FIG. 17, the magnetic sensor 7 according to the seventh embodiment differs from the magnetic sensor 1 according to the first embodiment in that the external magnetic member 31 has a narrowed leading end portion and does not protrude from the substrate 10. Other basic configurations are the same as those of the magnetic sensor 1 according to the first embodiment, so the same reference numerals are given to the same elements, and overlapping description will be omitted.

In the example illustrated in FIG. 17, the leading end of the external magnetic member 31 is narrowed in both the x- and y-directions. The narrowed portion constitutes a separating part 31s separating from the surface 11 of the substrate 10. In the present embodiment, the compensating coil 41 is wound at the separating part 31s, thereby preventing contact between the compensating coil 41 and the substrate 10.

As exemplified by the present embodiment, the compensating coil 41 may be wound at a position overlapping the substrate 10. Although the separating part 31s is narrowed in both the x- and y-directions in the example illustrated in FIG. 17, it may have any shape as long as contact between the compensating coil 41 and substrate 10 can be prevented.

Figure 18:
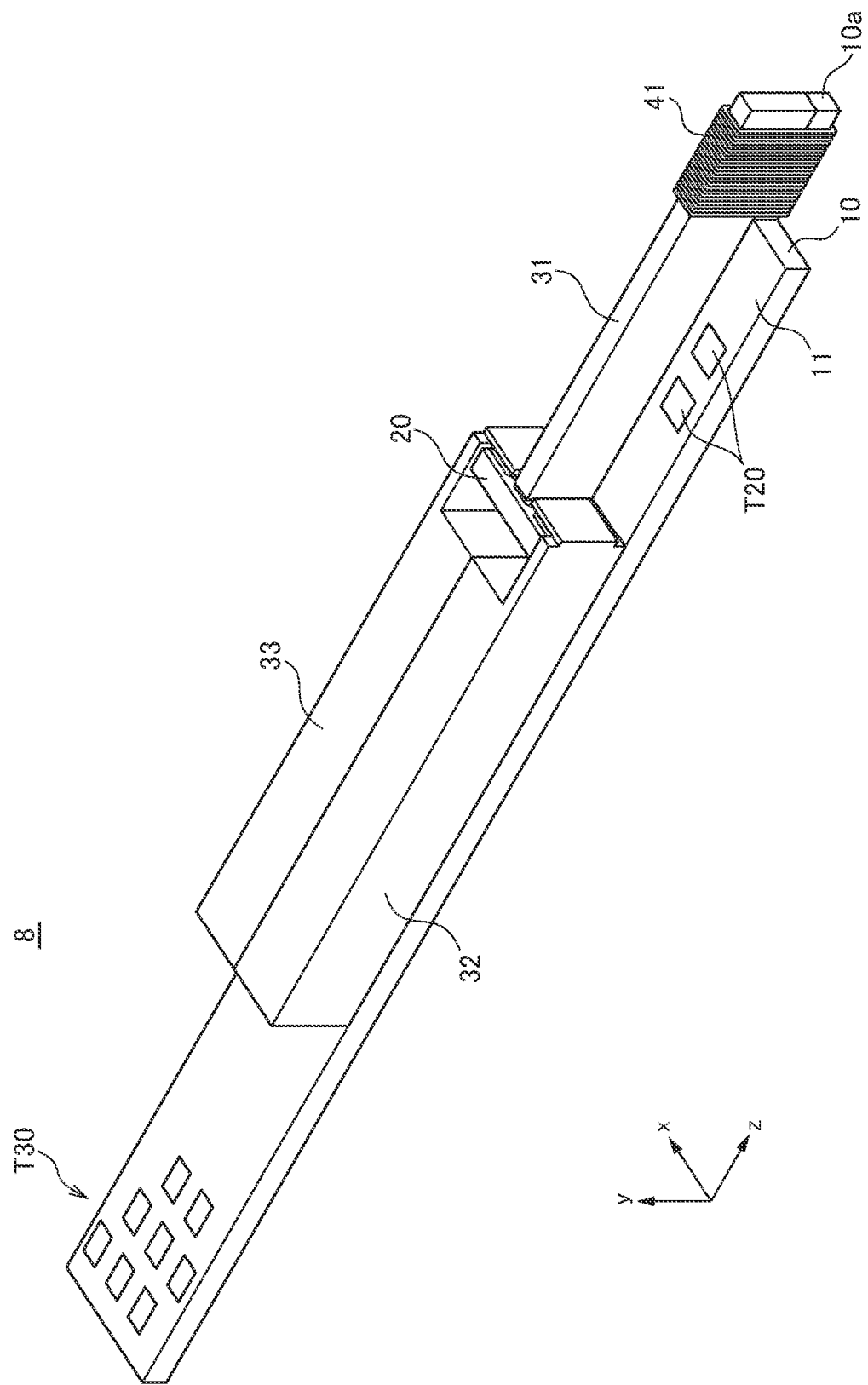
FIG. 18 is a schematic perspective view illustrating the outer appearance of a magnetic sensor 8 according to an eighth embodiment of the present invention.

FIG. 18 is a schematic perspective view illustrating the outer appearance of a magnetic sensor 8 according to an eighth embodiment of the present invention.

As illustrated in FIG. 18, the magnetic sensor 8 according to the eighth embodiment differs from the magnetic sensor 1 according to the first embodiment in that an end part 10a of the substrate 10 that overlaps the leading end of the external magnetic member 31 has a reduced width comparable to the external magnetic member 31 and that the compensating coil 41 is wound around both the end part 10a of the substrate 10 and the external magnetic member 31 as one body. Correspondingly, the external magnetic member 31 does not have the protruding part 31z and overlaps the substrate 10 as a whole. Other basic configurations are the same as those of the magnetic sensor 1 according to the first embodiment, so the same reference numerals are given to the same elements, and overlapping description will be omitted.

As exemplified by the present embodiment, the compensating coil 41 may be wound around both the external magnetic member 31 and substrate 10 as one body. Even in this case, interference between the compensating coil 41 and the substrate 10 can be prevented, and the external magnetic member 31 is made less likely to be broken even in case of external force being applied since the entire external magnetic member 31 overlaps the substrate 10.

Figure 19:
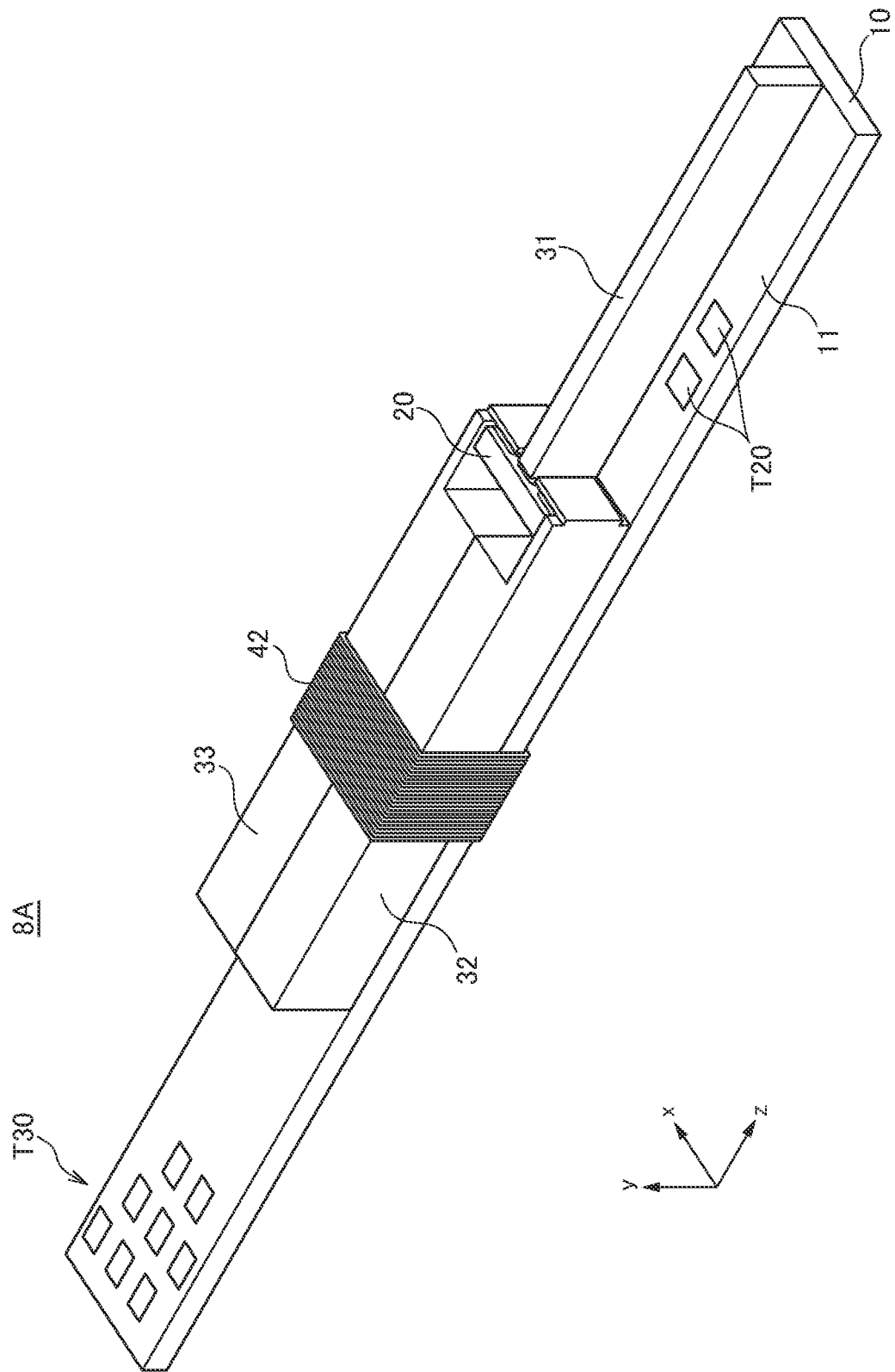
FIG. 19 is a schematic perspective view illustrating the outer appearance of a magnetic sensor 8A according to a first modification of the eighth embodiment.

FIG. 19 is a schematic perspective view illustrating the outer appearance of a magnetic sensor 8A according to a first modification of the present embodiment. As illustrated in FIG. 19, the magnetic sensor 8A according to the modification is configured such that the compensating coil 41 is omitted and, instead, the compensating coil 42 is wound around the external magnetic members 32 and 33 and the substrate 10 as one body. Thus, the substrate 10 may be wound with the compensating coil 42 together with the external magnetic members 32 and 33.

Figure 20:
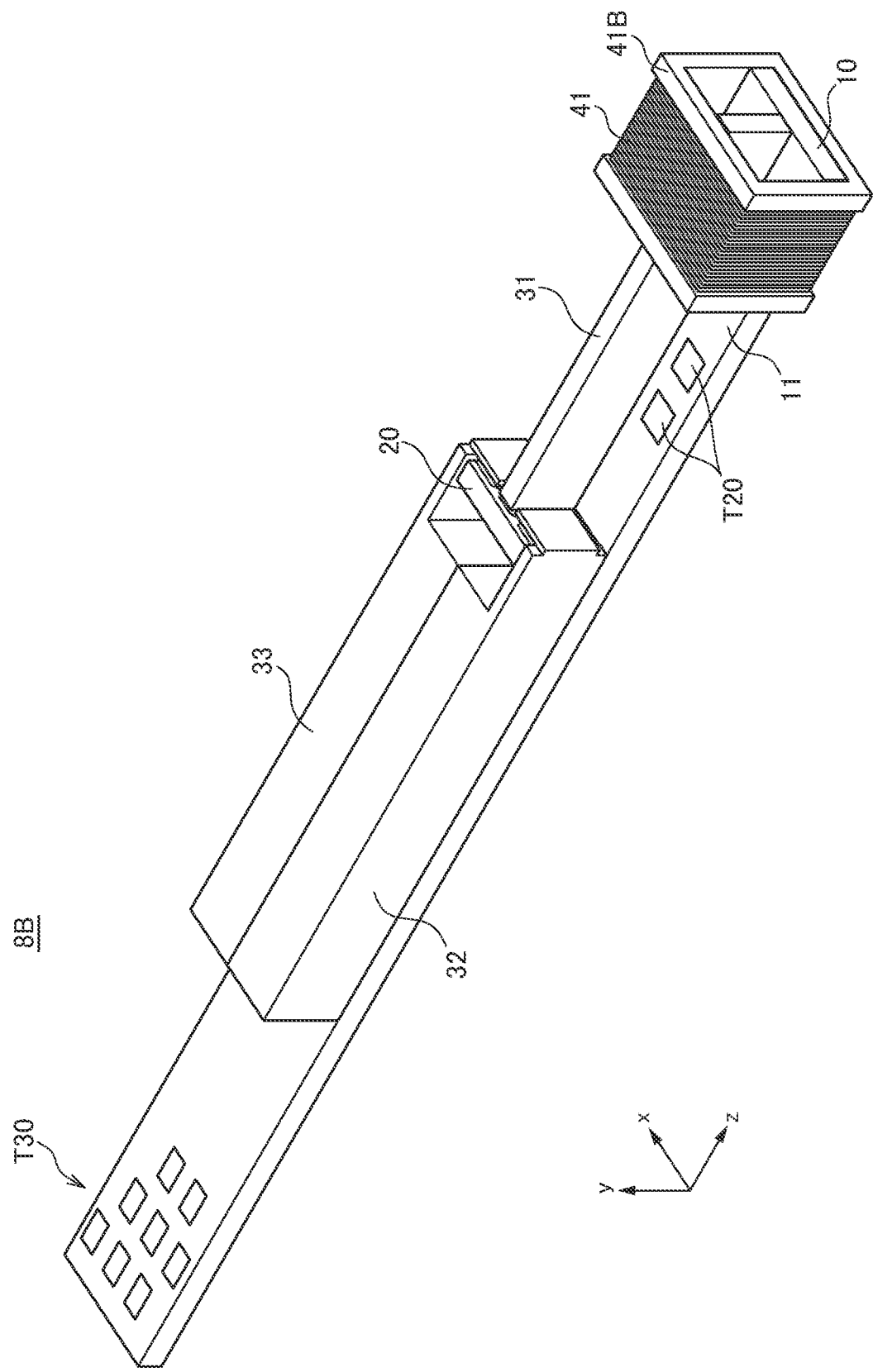
FIG. 20 is a schematic perspective view illustrating the outer appearance of a magnetic sensor 8B according to a second modification of the eighth embodiment.

FIG. 20 is a schematic perspective view illustrating the outer appearance of a magnetic sensor 8B according to a second modification of the present embodiment. As illustrated in FIG. 20, the magnetic sensor 8B according to the modification is configured such that the compensating coil 41 is wound around the bobbin 41B made of resin or the like and that the substrate 10 and the external magnetic member 31 are inserted into the inner diameter area of the bobbin 41B. Thus winding the compensating coil 41 around the bobbin 41B eliminates the need to directly wind the compensating coil 41 around the external magnetic member 31. That is, simplified manufacturing is achieved by mounting the sensor chip 20 and external magnetic member 31 on the substrate 10 and then by disposing the bobbin 41B wound with the compensating coil 41 so as to receive insertion of the resultant substrate 10, thus achieving improvement in assembly workability. In addition, using the bobbin 41B allows accurate winding of the compensating coil 41, with the result that accuracy of a magnetic field applied by the compensating coil 41 is improved.

Figure 21:
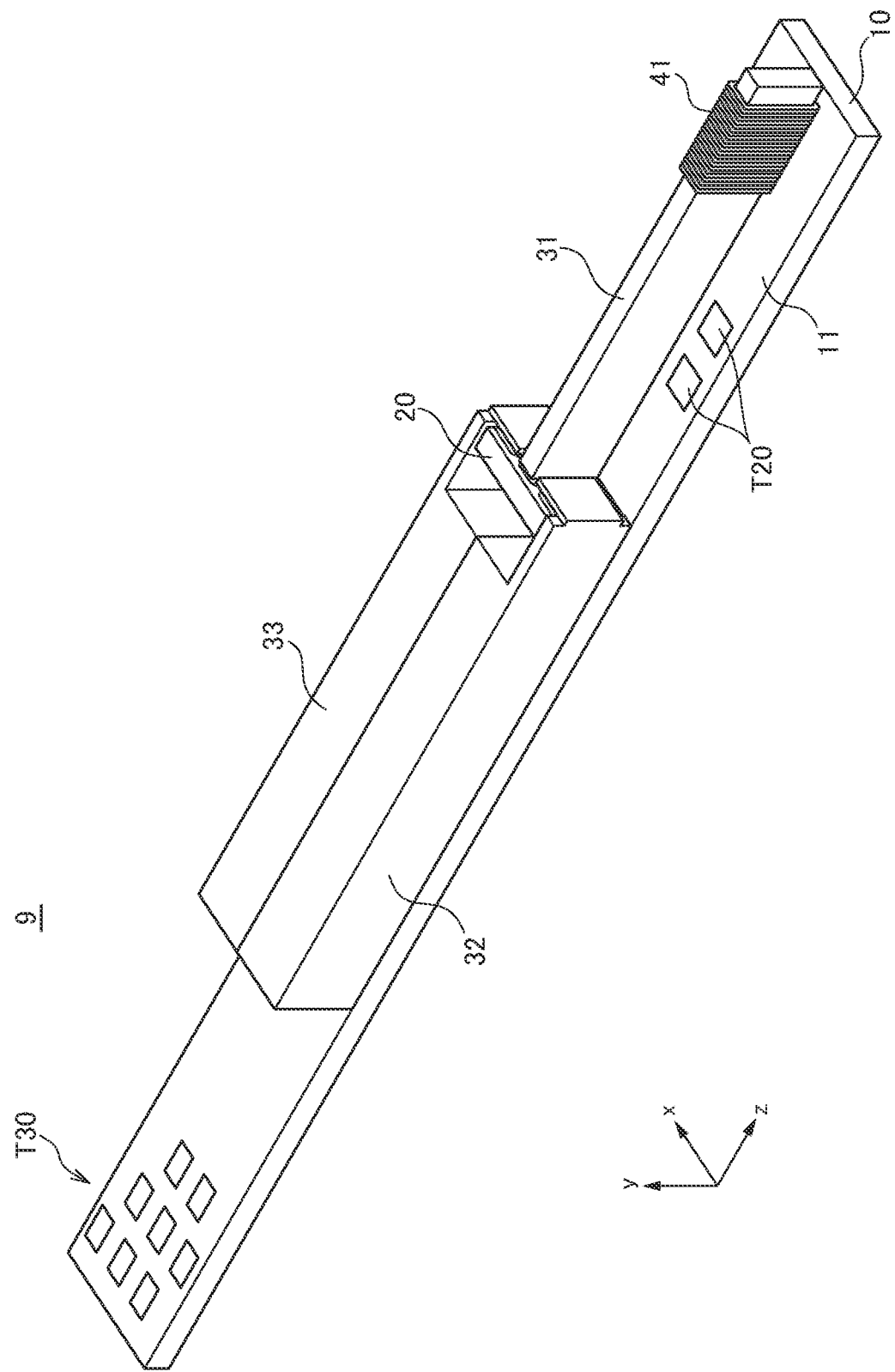
FIG. 21 is a schematic perspective view illustrating the outer appearance of a magnetic sensor 9 according to a ninth embodiment of the present invention.

FIG. 21 is a schematic perspective view illustrating the outer appearance of a magnetic sensor 9 according to a ninth embodiment of the present invention.

As illustrated in FIG. 21, the magnetic sensor 9 according to the ninth embodiment differs from the magnetic sensor 1 according to the first embodiment in that the external magnetic member 31 does not protrude from the substrate 10. Correspondingly, the external magnetic member 31 does not have the protruding part 31z and overlaps the substrate 10 as a whole. Other basic configurations are the same as those of the magnetic sensor 1 according to the first embodiment, so the same reference numerals are given to the same elements, and overlapping description will be omitted.

As exemplified by the present embodiment, interference between the compensating coil 41 and the substrate 10 need not necessarily be prevented in the present invention.

While the preferred embodiment of the present invention has been described, the present invention is not limited to the above embodiment, and various modifications may be made within the scope of the present invention, and all such modifications are included in the present invention.

For example, although the four magnetosensitive elements R1 to R4 are bridge-connected in the above embodiments, the use of four magnetosensitive elements is not essential in the present invention.

REFERENCE SIGNS LIST 1, 1A, 1B, 2, 2A, 3, 4, 4A, 5, 6, 6A, 7, 8, 8A, 8B, 9 magnetic sensor
10 substrate
10a end part of substrate
11 surface of substrate
12, 15, 16 slit
13, 14 opening
20 sensor chip
21 element formation surface
22 back surface of sensor chip
23-26 side surfaces of sensor chip
27, 28 insulating layer
31-33 external magnetic member
31s separating part
31z protruding part
41-44 compensating coil
41B bobbin
51 differential amplifier
52 detection circuit
G1-G4 magnetic gap
M1-M3, M11, M21, M31, M12, M22, M32 magnetic layer
R1-R4 magnetosensitive element
T10, T20, T30 terminal electrode group
T11-114, T21, T22 terminal electrode

What is claimed is:

1. A magnetic sensor comprising:
a substrate;
a sensor chip provided with an element formation surface having at least one magnetosensitive element formed thereon, the sensor chip being mounted on a surface of the substrate such that the element formation surface is perpendicular to the surface of the substrate or inclined by a predetermined angle with respect to the surface of the substrate;
at least one external magnetic member mounted on the surface of the substrate and collecting a magnetic field to be detected in the magnetosensitive element; and
a compensating coil wound around the external magnetic member at a position not overlapping the substrate.

2. The magnetic sensor as claimed in claim 1,
wherein the external magnetic member has a protruding part protruding from the surface of the substrate, and
wherein the compensating coil is wound around the protruding part.

3. The magnetic sensor as claimed in claim 1,
wherein the substrate has a slit or an opening overlapping the external magnetic member, and
wherein the compensating coil is disposed at a position overlapping the slit or opening.

4. A magnetic sensor comprising:
a substrate;
a sensor chip provided with an element formation surface having at least one magnetosensitive element formed thereon, the sensor chip being mounted on a surface of the substrate such that the element formation surface is perpendicular to the surface of the substrate or inclined by a predetermined angle with respect to the surface of the substrate;

at least one external magnetic member mounted on the surface of the substrate and collecting a magnetic field to be detected in the magnetosensitive element; and a compensating coil wound around both the external magnetic member and the substrate as one body.

5. A magnetic sensor comprising:

a substrate;

a sensor chip provided with an element formation surface having at least one magnetosensitive element formed thereon, the sensor chip being mounted on a surface of the substrate such that the element formation surface is perpendicular to the surface of the substrate or inclined by a predetermined angle with respect to the surface of the substrate;

at least one external magnetic member mounted on the surface of the substrate and collecting a magnetic field to be detected in the magnetosensitive element; and a compensating coil wound around the external magnetic member, wherein the at least one magnetosensitive element includes a plurality of bridge-connected magnetosensitive elements including first and second magnetosensitive elements, and wherein the at least one external magnetic member includes a first external magnetic member disposed between the first and second magnetosensitive elements as viewed in a direction perpendicular to the element formation surface.

6. The magnetic sensor as claimed in claim 5, wherein the compensating coil is wound around the first external magnetic member.

7. The magnetic sensor as claimed in claim 6, wherein the at least one external magnetic member further includes a second external magnetic member that covers a back surface of the sensor chip that is positioned on a side opposite to the element formation surface.

8. The magnetic sensor as claimed in claim 5, wherein the at least one external magnetic member further includes a second external magnetic member that covers a back surface of the sensor chip that is positioned on a side opposite to the element formation surface.

9. The magnetic sensor as claimed in claim 8, wherein the compensating coil is wound around the second external magnetic member.

* * * * *